(12) United States Patent
Park et al.

(10) Patent No.: US 12,298,633 B2
(45) Date of Patent: May 13, 2025

(54) DISPLAY DEVICE

(71) Applicant: SAMSUNG DISPLAY CO., LTD., Yongin-si (KR)

(72) Inventors: Han Ho Park, Yongin-si (KR); Dae Geun Lee, Hwaseong-si (KR); Su Jeong Kim, Gimcheon-si (KR); Sang Won Yeo, Cheonan-si (KR); Kyung Mok Lee, Bucheon-si (KR); Wu Hyen Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/537,672

(22) Filed: Dec. 12, 2023

(65) Prior Publication Data

US 2024/0111194 A1  Apr. 4, 2024

Related U.S. Application Data

(63) Continuation of application No. 17/743,101, filed on May 12, 2022, now Pat. No. 11,874,569, which is a
(Continued)

(30) Foreign Application Priority Data

Nov. 30, 2016  (KR) .......................... 10-2016-0161408

(51) Int. Cl.
 *G02F 1/1345* (2006.01)
 *G02F 1/1333* (2006.01)
 (Continued)

(52) U.S. Cl.
 CPC ...... *G02F 1/13452* (2013.01); *G02F 1/13458* (2013.01); *G09F 9/35* (2013.01);
 (Continued)

(58) Field of Classification Search
 CPC ............ G02F 1/13452; G02F 1/13458; G02F 1/133305; G02F 1/13454; G09F 9/35;
 (Continued)

(56) References Cited

U.S. PATENT DOCUMENTS 6,297,868 B1  10/2001  Takenaka et al.
7,224,424 B2  5/2007  Hwang et al.
(Continued)

FOREIGN PATENT DOCUMENTS

CN  103094306 A  5/2013
JP  H1131698  2/1999
(Continued)

OTHER PUBLICATIONS

Taiwan Office Action from corresponding Taiwan Patent Application No. 106141968, Taiwan Office Action mailed Aug. 12, 2021 (7 pgs.).

(Continued)

*Primary Examiner* — Nathanael R Briggs
(74) *Attorney, Agent, or Firm* — Womble Bond Dickinson (US) LLP

(57) ABSTRACT

A display device includes a substrate, conductive pads arranged on the substrate over a plurality of rows, and a drive circuit chip including bumps arranged over a plurality of rows to be electrically connected with the conductive pads, and the conductive pads arranged in a same row are arranged in parallel, and the bumps arranged in a same row are arranged in a zigzag form so as to be partially shifted.

15 Claims, 23 Drawing Sheets

Related U.S. Application Data continuation of application No. 17/025,857, filed on Sep. 18, 2020, now Pat. No. 11,347,120, which is a continuation of application No. 16/422,708, filed on May 24, 2019, now Pat. No. 10,782,573, which is a continuation of application No. 15/807,455, filed on Nov. 8, 2017, now Pat. No. 10,303,017.

(51) Int. Cl.
| | |
|---|---|
| *G09F 9/35* | (2006.01) |
| *H01L 23/00* | (2006.01) |
| *H05K 1/11* | (2006.01) |
| *H05K 3/32* | (2006.01) |

(52) U.S. Cl.
CPC .............. *H01L 24/06* (2013.01); *H05K 1/117* (2013.01); *H05K 1/118* (2013.01); *H05K 3/321* (2013.01); *G02F 1/133305* (2013.01); *G02F 1/13454* (2013.01); *H01L 2224/50* (2013.01); *H01L 2224/79* (2013.01); *H01L 2224/86* (2013.01); *H01L 2225/06579* (2013.01); *H05K 2201/09427* (2013.01); *H05K 2201/10128* (2013.01); *H05K 2201/10681* (2013.01)

(58) Field of Classification Search
CPC . H01L 24/06; H01L 2224/50; H01L 2224/79; H01L 2224/86; H01L 2225/06579; H05K 1/117; H05K 1/118; H05K 3/321; H05K 2201/09427; H05K 2201/10128; H05K 2201/10681
See application file for complete search history.

(56) References Cited

U.S. PATENT DOCUMENTS

| | | | |
|---|---|---|---|
| 7,446,844 B2 | 11/2008 | Hong | |
| 7,538,430 B2 | 5/2009 | Yoshioka et al. | |
| 7,728,442 B2 | 6/2010 | Yoshioka et al. | |
| 7,771,205 B2 | 8/2010 | Shiramizu et al. | |
| 7,876,122 B2 | 1/2011 | Noumi et al. | |
| 8,183,142 B2 | 5/2012 | Yoshioka et al. | |
| 8,338,968 B2 | 12/2012 | Yoshioka et al. | |
| 8,624,403 B2 | 1/2014 | Yoshioka et al. | |
| 8,766,271 B2 | 7/2014 | Kim et al. | |
| 9,159,650 B2 | 10/2015 | Yoshioka et al. | |
| 9,576,924 B2 | 2/2017 | Yoshioka et al. | |
| 9,875,674 B2 | 1/2018 | Zhang et al. | |
| 9,929,185 B2 | 3/2018 | Yoshioka et al. | |
| 10,303,017 B2 | 5/2019 | Park et al. | |
| 10,304,867 B2 | 5/2019 | Yoshioka et al. | |
| 10,782,573 B2 | 9/2020 | Park et al. | |
| 10,957,719 B2 | 3/2021 | Yoshioka et al. | |
| 11,347,120 B2 | 5/2022 | Park et al. | |
| 2007/0045516 A1 | 3/2007 | Hong | |
| 2007/0045832 A1 | 3/2007 | Peng et al. | |
| 2007/0080416 A1 | 4/2007 | Yoshioka et al. | |
| 2007/0188693 A1 | 8/2007 | Hwang et al. | |
| 2008/0090314 A1 | 4/2008 | Ichihara et al. | |
| 2009/0153765 A1* | 6/2009 | Yamashita | H05K 3/323 361/679.21 |
| 2009/0243641 A1 | 10/2009 | Noumi et al. | |
| 2011/0199569 A1 | 8/2011 | Matsui et al. | |
| 2014/0321088 A1* | 10/2014 | Bae | H05K 1/117 361/767 |
| 2015/0061723 A1 | 3/2015 | Zhang et al. | |
| 2015/0103500 A1 | 4/2015 | Bae et al. | |
| 2015/0366049 A1 | 12/2015 | Lee | |
| 2016/0043153 A1 | 2/2016 | Min | |
| 2018/0033757 A1 | 2/2018 | Yajima | |
| 2019/0244978 A1 | 8/2019 | Yoshioka et al. | |

FOREIGN PATENT DOCUMENTS

| | | |
|---|---|---|
| JP | 2002-076048 A | 3/2002 |
| JP | 2004-037859 A | 2/2004 |
| JP | 2004-096564 A | 3/2004 |
| JP | 2004-134471 A | 4/2004 |
| JP | 2004-252466 A | 9/2004 |
| JP | 2005-234105 A | 9/2005 |
| JP | 2006-013421 A | 1/2006 |
| JP | 2007-058174 A | 3/2007 |
| JP | 2008-098402 A | 4/2008 |
| JP | 2009-237280 A | 10/2009 |
| JP | 2014-082282 A | 5/2014 |
| JP | 2015-049435 A | 3/2015 |
| KR | 2000-0060587 A | 10/2000 |
| KR | 10-2006-0112521 A | 11/2006 |
| KR | 10-2015-0022211 A | 3/2015 |
| KR | 10-2015-0054454 A | 5/2015 |
| KR | 10-2015-0117999 A | 10/2015 |
| KR | 2016-0019017 A | 2/2016 |
| TW | I395013 B1 | 5/2013 |
| TW | 2016-30057 | 8/2016 |

OTHER PUBLICATIONS

EPO Extended Search Report dated Jun. 8, 2018, for European Patent Application No. 17204723.5 (9 pages).

Korean Notice of Allowance dated Oct. 7, 2024, issued in corresponding Korean Patent Application No. 10-2016-0161408 (2 pages).

* cited by examiner

DISPLAY DEVICE

CROSS-REFERENCE TO RELATED APPLICATIONS

This application is a continuation of U.S. patent application Ser. No. 17/743,101, filed on May 12, 2022, which is a continuation of U.S. patent application Ser. No. 17/025,857, filed on Sep. 18, 2020, now U.S. Pat. No. 11,347,120, which is a continuation of U.S. patent application Ser. No. 16/422,708, filed on May 24, 2019, now U.S. Pat. No. 10,782,573, which is a continuation of U.S. patent application Ser. No. 15/807,455, filed on Nov. 8, 2017, now U.S. Pat. No. 10,303,017, which claims priority to and the benefit of Korean Patent Application No. 10-2016-0161408, filed on Nov. 30, 2016 in the Korean Intellectual Property Office, the entire disclosures of all of which are incorporated herein by reference.

BACKGROUND

1. Field

Aspects of embodiments of the present invention relate to a display device.

2. Description of the Related Art

Various kinds of display devices, such as an electrowetting display device (EWD), an electrophoresis display device (EPD), a plasma display panel (PDP), a field emission display device (FED), a liquid crystal display device (LCD), and an organic light emitting diode display device (OLED), have been developed.

Such a display device includes a display area in which a plurality of pixels is arranged to display an image and a non-display area in which drive integrated circuits for driving pixels (herein, referred to as "drive circuit chip") are disposed.

The drive circuit chip disposed in the non-display area is generally fabricated in the form of a chip, and is mounted according to a chip on glass (COG) method or is mounted on a display panel according to a tape carrier package (TCP) method using a tape automated bonding (TAB) technology.

Recently, compact display devices have been required. Thus, a display device in which a drive circuit chip is directly mounted on the edge of a substrate to improve integration degree has been developed and used. Further, a flexible display device formed using a plastic substrate has been developed.

However, there are many technical difficulties in directly mounting a drive circuit chip on a substrate. When the drive circuit chip is directly mounted on the substrate, there is a problem that the pads and wirings of the substrate electrically connected with the drive circuit chip are cracked or broken due to factors such as pressure and temperature during the mounting process. In particular, such defects are more serious in the case of a flexible display device.

SUMMARY

According to an exemplary embodiment of the present disclosure, a display device includes a substrate, conductive pads arranged on the substrate over a plurality of rows, and a drive circuit chip including bumps arranged over a plurality of rows to be electrically connected with the conductive pads, wherein conductive pads arranged in a same row are arranged in parallel, and the bumps arranged in a same row are arranged in a zigzag form so as to be partially shifted.

According to another exemplary embodiment of the present disclosure, a display device includes a substrate, conductive pads arranged on the substrate over a plurality of rows, and a drive circuit chip including bumps arranged over a plurality of rows to be electrically connected with the conductive pads, wherein a shifted length between the conductive pads arranged adjacent to a same row in a column direction perpendicular to a row direction is shorter than a shifted length between the bumps arranged adjacent to a same row in the column direction.

According to an aspect of the present invention, a display device includes a drive circuit chip safely mounted on a substrate without causing cracks or damage.

However, aspects of the present invention are not restricted to the above aspects. The above and other aspects of the present invention will become more apparent to one of ordinary skill in the art to which the present invention pertains by referencing the detailed description of some embodiments of the present invention set forth below.

BRIEF DESCRIPTION OF THE DRAWINGS

The above and other aspects and features of the present invention will become more apparent by describing in further detail some exemplary embodiments thereof with reference to the attached drawings, in which.

DETAILED DESCRIPTION

Figure 1:
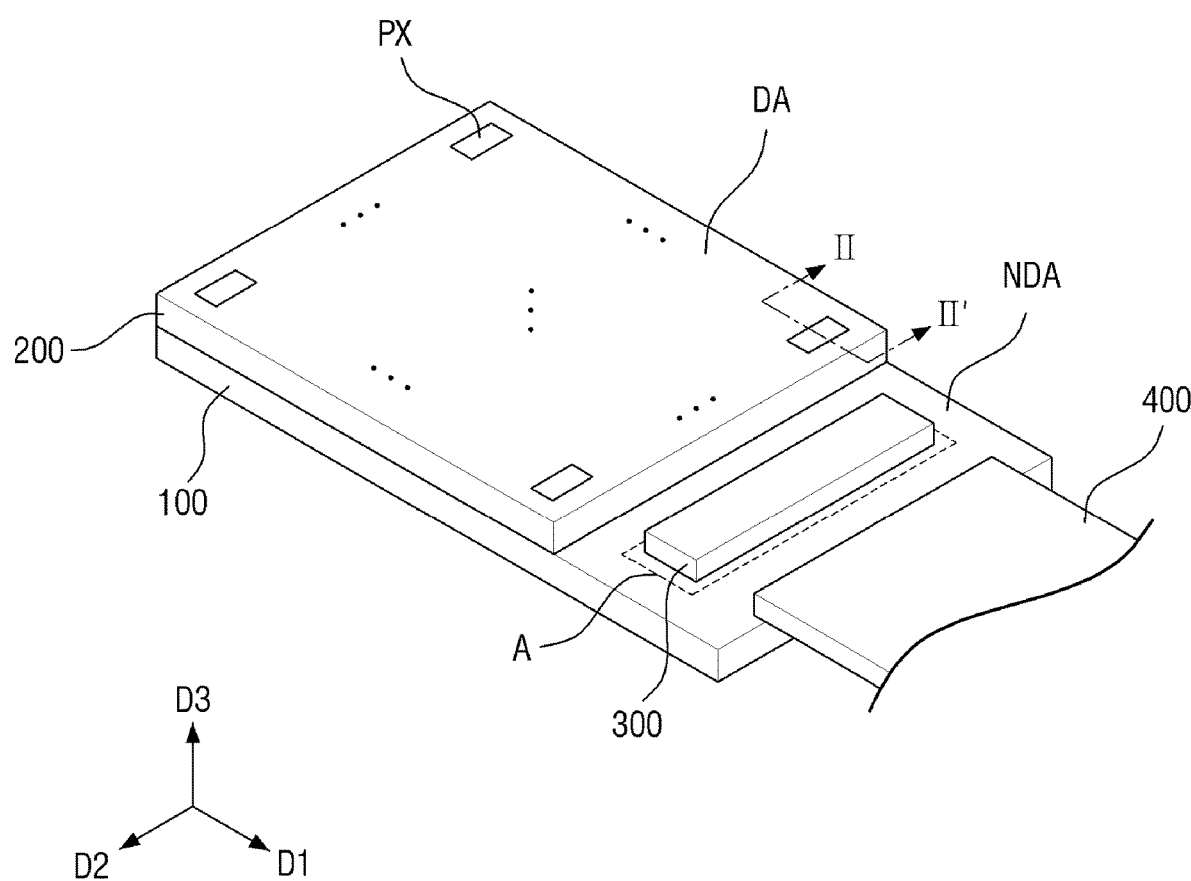
FIG. 1 is a perspective view of a display device according to an embodiment of the present invention.

The present invention will now be described more fully hereinafter with reference to the accompanying drawings, in which some exemplary embodiments of the invention are shown. This invention may, however, be embodied in different forms and should not be construed as limited to the embodiments set forth herein. Rather, these embodiments are provided so that this disclosure will be thorough and complete, and will convey the scope of the invention to those skilled in the art. The same reference numbers indicate the same components throughout the specification. In the attached drawing figures, the thickness of layers and regions may be exaggerated for clarity.

It is to be understood that, although the terms "first," "second," "third," etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. As used herein, "or" means "and/or," and the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

In the present invention, an electronic apparatus may be any apparatus provided with a display device. Examples of the electronic apparatus may include smart phones, mobile phones, navigators, game machines, TVs, car head units, notebook computers, laptop computers, tablet computers, personal media players (PMPs), and personal digital assistants (PDAs). The electronic apparatus may be embodied as a pocket-sized portable communication terminal having a wireless communication function. Further, the display device may be a flexible display device capable of changing its shape.

Hereinafter, some embodiments of the present invention will be described with reference to the attached drawings.

FIG. 1 is a perspective view of a display device according to an embodiment of the present invention.

Referring to FIG. 1, a display device according to an embodiment of the present invention includes a first substrate 100, a second substrate 200, a drive circuit chip 300, and a flexible circuit board 400. Here, the second substrate 200 has a smaller area than the first substrate 100.

An area where the first substrate 100 and the second substrate 200 overlap each other is referred to as a display area DA, and an edge area of the first substrate 100 not overlapping the second substrate 200 is referred to as a non-display area NDA.

A plurality of pixels PX is arranged in the display area DA, and the drive circuit chip 300 for driving the pixels PX is mounted in the non-display area NDA. That is, the drive circuit chip 300 may be mounted on the first substrate 100 in the non-display area NDA.

The drive circuit chip 300 applies drive signals to the plurality of pixels PX arranged in the display area DA, and thus a desired image may be displayed on the plurality of pixels PX arranged in the display area DA. The plurality of pixels PX may be arranged in the form of a matrix along a first directional axis D1 and a second directional axis D2 which are orthogonal to each other. The drive circuit chip 300 may include a drive circuit body 310 and a plurality of conductive bumps (not shown) including an output bump OPB.

In an embodiment of the present invention, the pixels PX may include first to third pixels (not shown) respectively expressing a red color, a green color, and a blue color. In some embodiments of the present invention, the pixels PX may further include some of pixels respectively expressing yellow, cyan, and magenta. Moreover, the present invention is not limited thereto, and the pixels PX may further include a pixel expressing white.

Depending on the structure of the pixels PX, display devices may be classified into any of a liquid crystal display device, an organic light emitting display device, and the like. As the display device according to an embodiment, an organic light emitting display device will be described as an example. However, the present invent invention is not limited thereto, and it is to be understood that the content according to each embodiment of the present invention may be applied to a liquid crystal display device or the like.

The drive circuit chip 300 and the first substrate 100 are electrically connected to each other through a plurality of conductive pads (not shown) formed in the drive circuit chip 300 and a plurality of conductive pads (not shown) formed on the first substrate 100. The plurality of conductive pads formed on the first substrate 100 may be connected to the respective pixels PX through a plurality of conductive lines, so as to transmit the signals inputted from the drive circuit chip 300 to the pixels PX.

The flexible circuit board 400 may include a plurality of conductive lines (not shown), and may be disposed in the non-display area NDA. The flexible circuit board 400 may provide externally provided signals such as a video data signal (not shown), a vertical synchronization signal (not shown), and the like to the first substrate 100, and may transmit these signals to the drive circuit chip 300.

Figure 2:
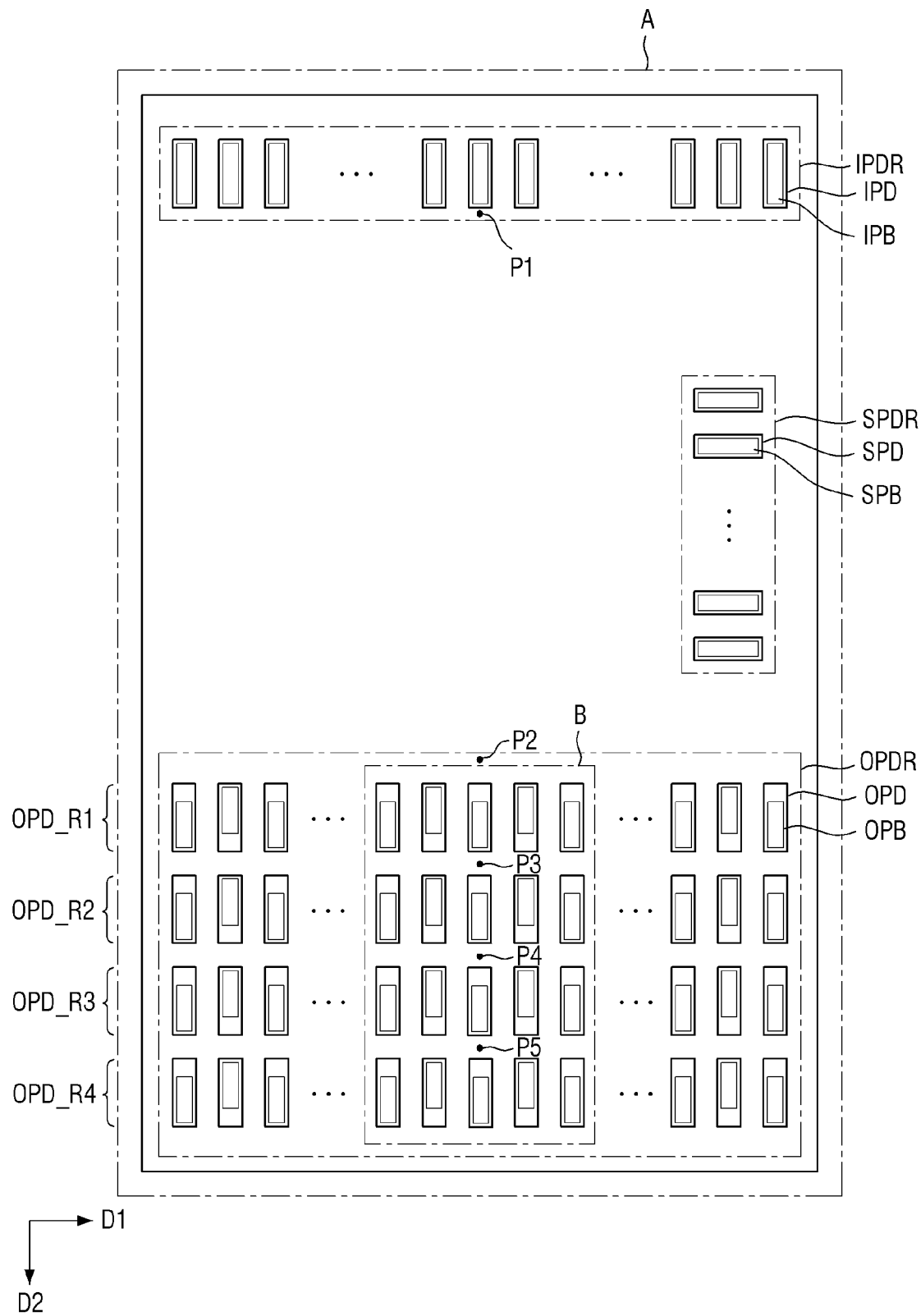
FIG. 2 is a layout diagram of a region "A" of FIG. 1, showing bumps and pads of the display device of FIG. 1.

Referring to FIG. 2, a relationship between the drive circuit chip 300 and the first substrate 100 will be further described.

FIG. 2 is a layout diagram of a region "A" showing bumps and pads of the display device of FIG. 1.

Referring to FIG. 2, the first substrate 100 of the display device according to an embodiment of the present invention includes an input pad region IPDR, a side pad region SPDR, and an output pad region OPDR.

The input pad region IPDR may include a plurality of input pads IPDs arranged along the first directional axis D1 to form a row. The respective input pads IPDs may be arranged to correspond to input bumps IPBs. The side pad region SPDR may include a plurality of side pads SPDs arranged along the second directional axis D2 to form a column. The respective side pads SPDs may be arranged to correspond to side bumps SPBs.

The illustrated arrangement of the input pads IPDs and the side pads SPDs respectively included in the input pad region IPDR and the side pad region SPDR is exemplary. That is, the arrangement of the input pads IPDs and the side pads SPDs may be changed in accordance with an arrangement of the input bumps IPBs of the drive circuit chip 300 connected to the respective input pads IPDs and the side bumps SPBs of the drive circuit chip 300 connected to the respective side pads SPDs.

The input pad region IPDR and the side pad region SPDR are provided with various signals provided from the outside of the display device according to an embodiment of the present invention, and the various signals may be provided to the drive circuit chip 300 through the plurality of input bumps IPBs arranged corresponding to the input pad region IPDR and the plurality of side bumps SPBs arranged corresponding to the side pad region SPDR.

The output pad region OPDR includes a plurality of output pads OPDs. The output pad region OPDR may include a plurality of output pad rows OPD_Rs in each of which a plurality of output pads OPDs are arranged along the first directional axis D1. As shown in FIG. 2, the output pad region OPDR may include first to fourth output pad rows OPD_R1, OPD_R2, OPD_R3, and OPD_R4, for example.

The output pad region OPDR can receive various signals outputted from the drive circuit chip 300 through a plurality of output bumps OPBs arranged corresponding to the output pad region OPDR. The various signals provided to the output pad region OPDR may be provided to each of the pixels PX arranged in the display area DA through a plurality of lines (not shown) connected to the output pad region OPDR. Here, since the number of pixels PX controlled by the drive circuit chip 300 is very large, the output pad region OPDR may include a number of output pads OPDs greater than the number of the input pads IPDs of the input pad region IPDR or the number of the side pads SPDs of the side pad region SPDR.

In an embodiment, the output pads OPDs included in each of the first to fourth output pad rows OPD_R1, OPD_R2, OPD_R3, and OPD_R4 may have the same shape as each other, and may be arranged parallel to each other. That is, the respective output pads OPDs arranged in the same row may be arranged in parallel so as to be in contact with one reference line extending along the row direction. In the embodiment shown in FIG. 2, the row direction may be the same as a direction in which the first direction axis D1 extends.

Figure 3:
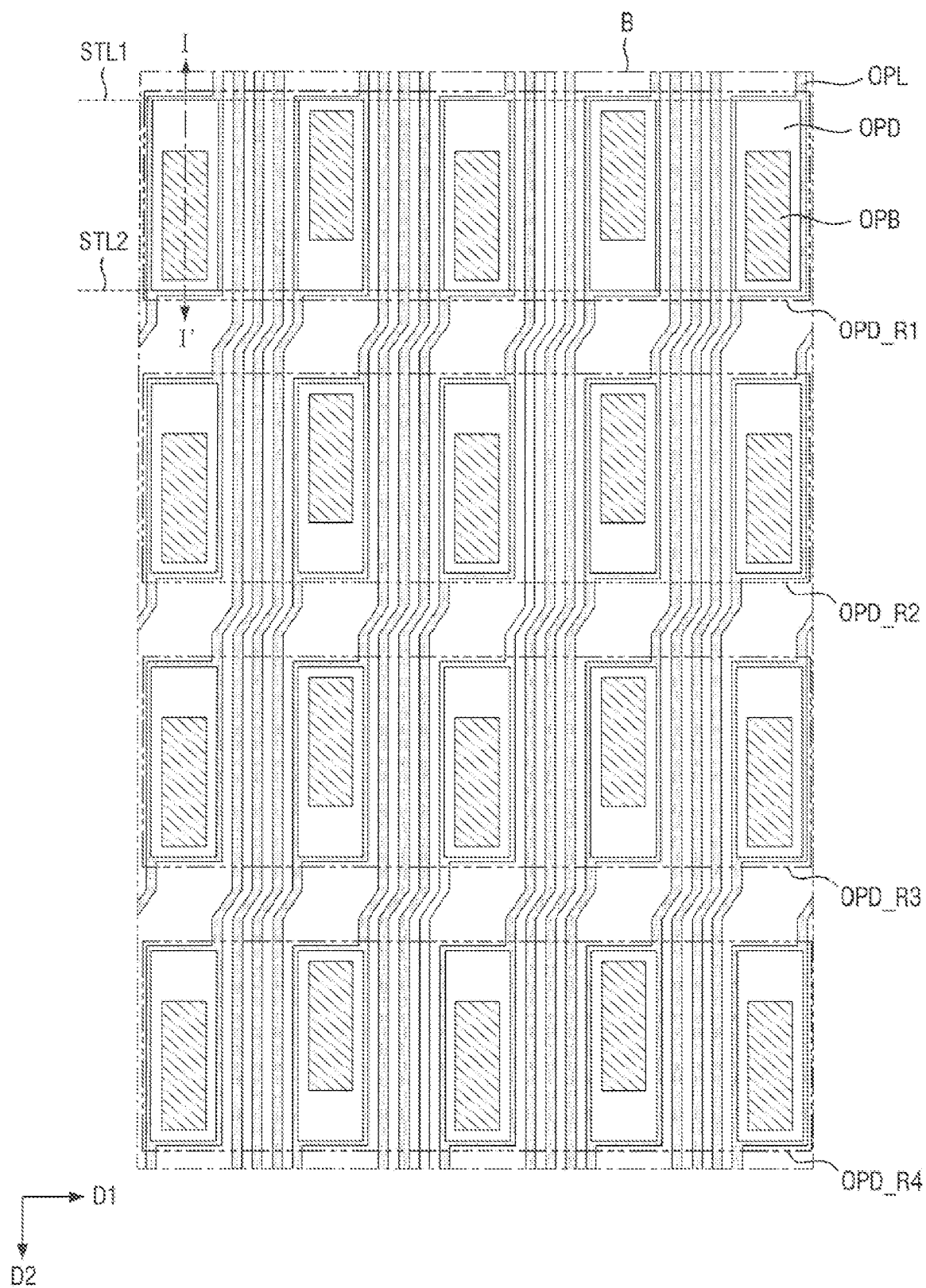
FIG. 3 is an enlarged layout diagram of a region "B" of FIG. 2.

Referring to FIG. 3, in an embodiment, each of the output pads OPDs arranged in the same row may be disposed such that one end of the column direction (that is, a direction in which the second directional axis D2 extends) is in contact with a first reference line STL1 extending along the row direction (that is, a direction in which the first directional axis D1 extends). Also, each of the output pads OPDs arranged in the same row may be disposed such that the other end (i.e. an end opposite to the one end) of the column direction (that is, a direction in which the second directional axis D2 extends) is in contact with a second reference line STL2 extending along the row direction (that is, a direction in which the first directional axis D1 extends) in parallel to the first reference line STL1.

Figure 6:
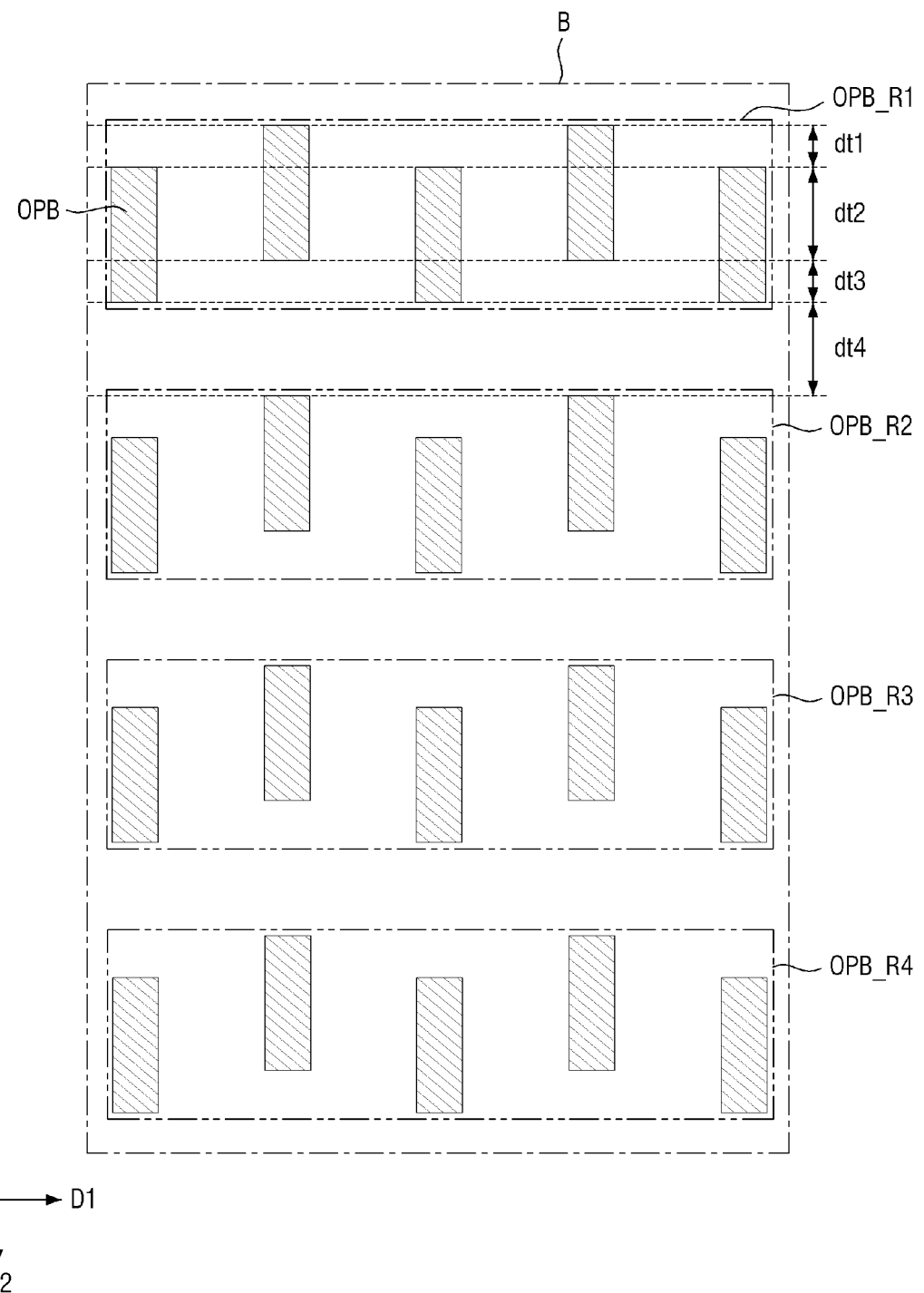
FIG. 6 is an enlarged layout diagram of the region "B" of FIG. 2, showing output bumps arranged in the region "B"

In contrast, with further reference to FIG. 6, the respective output bumps OPBs arranged to correspond to the output pad region OPDR, that is, the respective output bumps OPBs connected to the respective output pads OPDs included in the output pad region OPDR may be arranged to have a specific pattern. That is, the output bumps OPBs may include output bump rows OPB_R1, OPB_R2, OPB_R3, and OPB_R4 in each of which a plurality of output bumps OPBS are arranged along the first directional axis D1.

However, the output bumps OPBs included in the output bump rows OPB_R1, OPB_R2, OPB_R3, and OPB_R4 may have the same shape as each other, but may not be arranged in parallel to each other. In an embodiment, the output bumps OPBs arranged in the same row may be arranged to be shifted from each other in a zigzag form. That is, the output bumps OPBs arranged in the same row and adjacent to each other may be arranged to be partially shifted in the column direction (that is, a direction in which the second directional axis D2 extends).

In an embodiment, the output pads OPDs are not limited to being arranged in parallel along the row direction (that is, a direction in which the first direction axis D1 extends), and may also be arranged to be shifted in the column direction (that is, a direction in which the second directional axis D2 extends) between the output pads OPDs disposed adjacent to the same row. However, this case may be limited to a case where the lengths shifted in the column direction (that is, a direction in which the second directional axis D2 extends) between the output pads OPDs disposed adjacent to the same row are smaller than the lengths of the output bumps OPBs arranged corresponding to each other and arranged adjacent to the same row shifted in the column direction (that is, a direction in which the second directional axis D2 extends).

Figure 4:
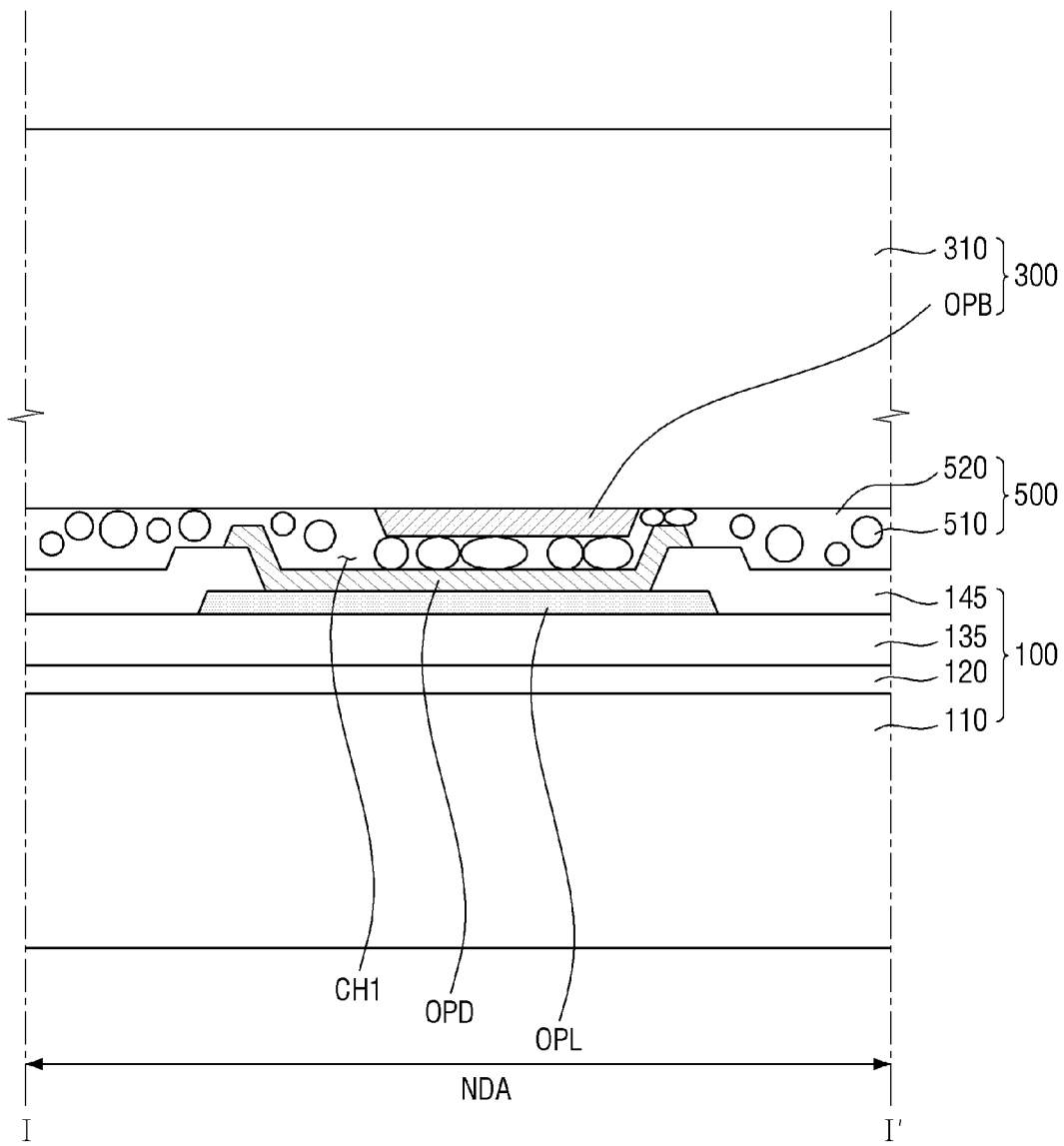
FIG. 4 is a sectional view taken along the line I-I' of FIG. 3.
Figure 5:
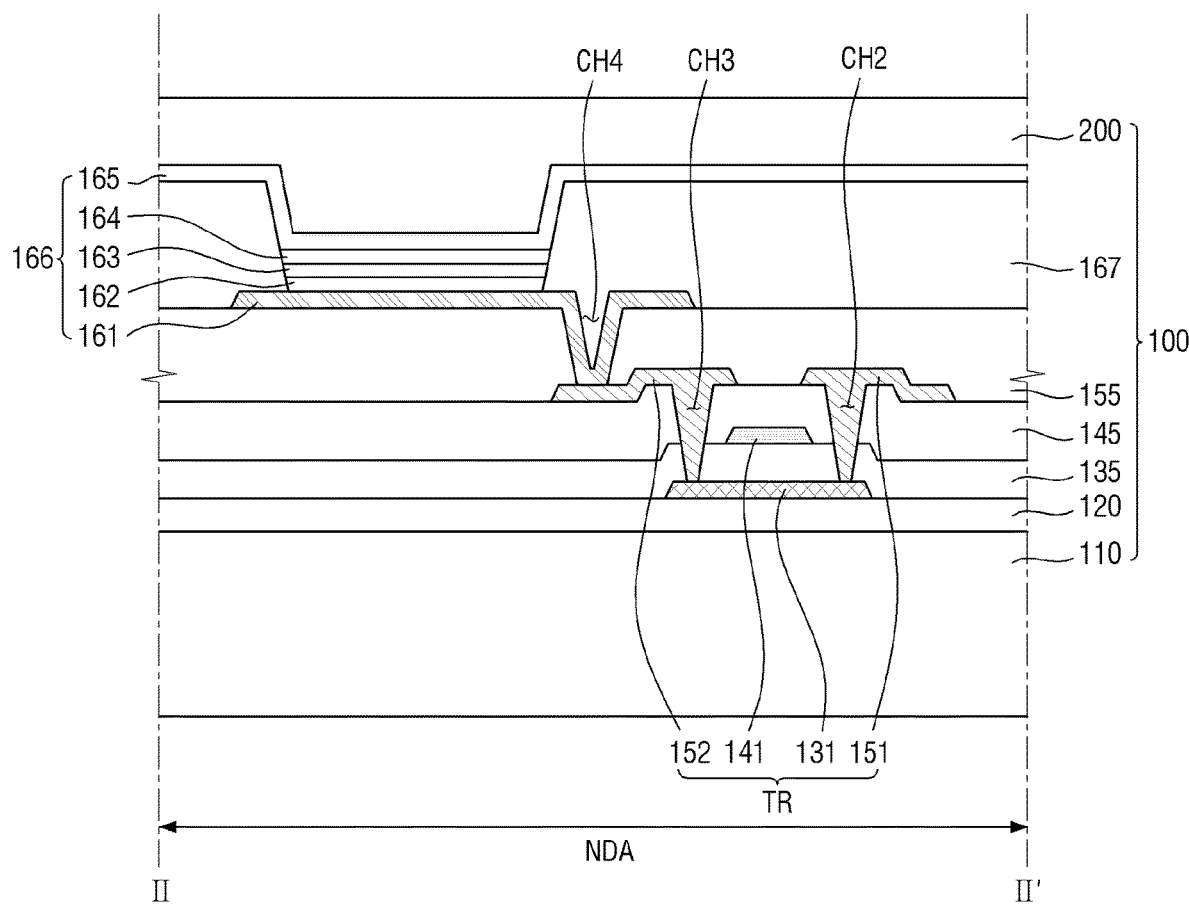
FIG. 5 is a sectional view taken along the line II-II' of FIG. 1.

From the aforementioned arrangement of the output pads OPDs and the output bumps OPBs, cracks and damage which may occur in mounting the drive circuit chip 300 can be minimized or reduced. A more detailed description of the arrangement of the output pads OPD and the output bumps OPBs will be described later. Referring to FIGS. 3 to 5, the structure of the output pads OPDs and the lines (not shown) connected to the output pads OPDs will be further described.

FIG. 3 is an enlarged layout diagram of a region "B" of FIG. 2; and FIG. 4 is a sectional view taken along the line I-I' of FIG. 3. Further, FIG. 5 is a sectional view taken along the line II-II' of FIG. 1.

In FIGS. 3 and 4, only the non-display area NDA of the first substrate 100 and the drive circuit chip 300 mounted thereon are shown. However, in order to clarify the relationship between each of the components arranged in the non-display area NDA of the first substrate 100 and each of the components arranged in the display area DA of the first substrate 100, FIG. 5, which is a sectional view of one pixel PX disposed in the display area DA, is additionally referred to.

Referring to FIGS. 3 to 5, the display device according to an embodiment of the present invention includes the first substrate 100 and the second substrate 200.

In an embodiment, the first substrate 100 includes a base substrate 110, a buffer layer 120, a semiconductor layer 131, a first insulating layer 135, a pad line OPL, a gate electrode 141, a second insulating layer 145, an output pad OPD, a source electrode 151, a drain electrode 152, a passivation layer 155, and an organic light emitting element 166.

In an embodiment, the base substrate 110 is made of a polymer material having excellent heat resistance, such as polyimide (PI), polyamide (PA), polyethylene terephthalate (PET), fiber-reinforced polymers (FRP), polycarbonate, polyethersulfone, polyarylate (PAR), and polyethylene naphthalate (PEN). However, the material of the base substrate 110 is not limited to the aforementioned polymer materials, and may be any material capable of performing a thin film process on the base substrate 110 and having excellent heat resistance.

The buffer layer 120 is disposed on one surface of the base substrate 110. The buffer layer 120 prevents or substantially prevents impurities present in the base substrate 110 from being introduced into the pixel PX during a manufacturing process. In particular, the buffer layer 120 may prevent or substantially prevent the impurities from diffusing into the semiconductor layer 131 of the pixel PX. The impurities may be introduced from the outside, or may be generated by the thermal decomposition of the base substrate 110. The impurities may be gas or sodium discharged from the base substrate 110. In addition, the buffer layer 120 may block moisture flowing into the pixel PX from the outside.

The semiconductor layer 131 is disposed on one surface of the buffer layer 120. The semiconductor layer 131 may contain polysilicon or amorphous silicon formed at a low temperature. In addition, the semiconductor layer 131 may contain a metal oxide semiconductor. The semiconductor layer 131 includes a channel region serving as a passage through which electrons or holes can travel, and a first ion doping region (not shown) and a second ion doping region (not shown) between which the channel region is disposed. The semiconductor layer 131 can function as a channel of a plurality of transistors arranged in each pixel PX.

The first insulating layer 135 is disposed on the semiconductor layer 131 to cover the semiconductor layer 131. The first insulating layer 135 includes an organic film and/or an inorganic film. In an embodiment, the first insulating layer 135 may include a plurality of inorganic thin films. The plurality of inorganic thin films may include a silicon nitride layer and a silicon oxide layer.

The gate electrode 141 and the pad line OPL are disposed on one surface of the first insulating layer 135. In an embodiment, the gate electrode 141 and the pad line OPL are made of a metal, such as Al, Ag, Cr, Ti, Ta, or Mo, or an alloy thereof. Although the gate electrode 141 and the pad line OPL are shown as a single layer in the drawings according to the present embodiment, the gate electrode 141 and the pad line OPL may be formed of a multilayer including a metal layer of Cr, Mo, Ti, Ta, or an alloy thereof, which is excellent in physiochemical properties, and a metal layer of an Al-based metal or an Ag-based metal. In addition, the gate electrode 141 and the pad line OPL may be formed of various metals or conductors, and, in an embodiment, the gate electrode 141 and the pad line OPL are multilayer films that can be patterned under the same etching conditions.

Although not shown, a plurality of gate lines (not shown) disposed to cross the plurality of pixels PX may be disposed in the display area DA.

The second insulating layer 145 is disposed on one surface of the gate electrode 141 and the pad line OPL. The second insulating layer 145 includes an organic film and/or an inorganic film. The second insulating layer 145 may include a plurality of inorganic thin films. The plurality of inorganic thin films may include a silicon nitride layer and a silicon oxide layer. In an embodiment, the second insulating layer 145 may be made of silicon nitride (SiNx) or the like.

The output pad OPD, the source electrode 151, and the drain electrode 152 are disposed on one surface of the second insulating layer 145. More specifically, the output pad OPD is disposed in the non-display area NDA, and the source electrode 151 and the drain electrode 152 are disposed in the display area DA.

The output pad OPD, the source electrode 151, and the drain electrode 152, similarly to the gate electrode 141 and the pad line OPL, may be made of a conductive material, such as chromium, molybdenum, aluminum or an alloy thereof, and may be formed as a single layer or a multilayer.

The output pad OPD may be connected to an output line through a first contact hole CH1 penetrating the second insulating layer 145. The signal provided to the output pad OPD may be provided to the pixel PX disposed in the display area DA through the output line.

At least a part of the source electrode 151 overlaps the gate electrode 141, and at least a part of the drain electrode 152 overlaps the gate electrode 141.

The source electrode 151 may be connected to the semiconductor layer 131 through a second contact hole CH2 penetrating the second insulating layer 145. The drain electrode 152 may be connected to the semiconductor layer 131 through a third contact hole CH 3 penetrating the second insulating layer 145. The source electrode 151, the drain electrode 152, and the semiconductor layer 131 may constitute a thin film transistor TR for controlling the driving of the pixel PX. In another embodiment of the present invention, the thin film transistor TR may be modified into a bottom gate structure and then implemented.

Since the display area DA and the non-display area NDA are different from each other in the lamination structure on one side of the output pad OPD, the source electrode 151, and the drain electrode 152, the lamination structure of the non-display area NDA will be described after the description of the lamination structure of the display area DA.

The passivation layer 155 is disposed on the source electrode 151 and the drain electrode 152 in the display area DA. The passivation layer 155 is disposed to overlap the second insulating layer 145, the output pad OPD, the source electrode 151, and the drain electrode 152, which are exposed upwards, and includes an organic film and/or an inorganic film. In an embodiment, the passivation layer 155 may contain an organic material to provide a planar surface.

A pixel defining layer 167 and the organic light emitting element 166 are disposed on one surface of the passivation layer 155. The organic light emitting element 166 includes an anode electrode 161, a hole transporting region 162, a light emitting layer 163, an electron transporting region 164, and a cathode electrode 165. The anode electrode 161 is connected to the drain electrode 152 through a fourth contact hole CH4 penetrating the passivation layer 155. In an embodiment, the positions of the anode electrode 161 and the cathode electrode 165 of the organic light emitting element 166 may be mutually changed.

The anode electrode 161 is disposed on one surface of the passivation layer 155. The opening OP of the pixel defining layer 167 exposes the anode electrode 161.

The anode electrode 161 may be a pixel (PX) electrode or a positive electrode. The anode electrode 161 may be a multi-layer structure having a plurality of layers made of a transparent metal oxide and a metal. For example, the anode electrode 161 may be made of ITO (indium tin oxide), IZO (indium zinc oxide), ZnO (zinc oxide), ITZO (indium tin zinc oxide), or the like. However, in another embodiment in which the anode electrode 161 is a semi-transmissive electrode or a reflective electrode, the anode electrode 161 may contain Ag, Mg, Al, Pt, Pd, Au, Ni, Nd, Ir, or a mixture thereof.

The hole transporting region 162 is disposed on the anode electrode 161. The hole transporting region 162 may include at least one of a hole injection layer (not shown), a hole transporting layer (not shown), a buffer layer (not shown), and an electron blocking layer (not shown).

The light emitting layer 163 is disposed on the hole transporting region 162. The light emitting layer 163 is not particularly limited as long as it is made of a commonly used material. For example, the light emitting layer 163 may be made of a material that emits red light, green light, and/or blue light, and may contain a fluorescent material or a phosphorescent material. Further, the light emitting layer 163 may include a host and a dopant.

The electron transporting region 164 is disposed on the light emitting layer 163. The electron transporting region 164 may include at least one of a hole blocking layer (not shown), an electron transporting layer (not shown), and an electron injection layer (not shown).

The cathode electrode 165 is disposed on the electron transporting region 164.

The cathode electrode 165 may be a common electrode or a negative electrode. The cathode electrode 165 may be a transmissive electrode, a semi-transmissive electrode, or a reflective electrode. In the case in which the cathode electrode 165 is a transmissive electrode, the cathode electrode 165 may be made of ITO (indium tin oxide), IZO (indium zinc oxide), ZnO (zinc oxide), ITZO (indium tin zinc oxide), or the like. In the case in which the cathode electrode 165 is a semi-transmissive electrode or a reflective electrode, the cathode electrode 165 may contain Ag, Mg, Al, Pt, Pd, Au, Ni, Nd, Ir, Cr, Li, Ca, LiF/Ca, LiF/Al, Mo, Ti, or a compound or mixture thereof (for example, a mixture of Ag and Mg).

The second substrate 200 is disposed on the cathode electrode 165. The second substrate 200 can protect the organic light emitting element 166 in the display device from the outside, and may be formed of an encapsulation layer. The encapsulation layer may include a single film or a plurality of thin film encapsulation layers. In an embodiment, the thin film encapsulation layers may include an inorganic film made of silicon nitride and silicon oxide and an organic film made of monomers, and may also be formed of an organic hybrid.

Herein, the lamination structure of the non-display area NDA will be described.

An anisotropic conductive film (ACF) 500 is disposed on the output pad OPD disposed in the non-display area NDA. The anisotropic conductive film 500 includes a plurality of conductive balls 510 having the characteristics of transmitting electricity and a film layer 520 for maintaining a film shape. The anisotropic conductive film 500 may electrically connect the input bump IPB, the side bump SPB and the output bump OPB of the drive circuit chip 300 to each other, and may electrically connect the input pad IPD, the side pad SPD and the output pad OPD of the first substrate 100 to each other. The anisotropic conductive film 500 may allow the drive circuit chip 300 to be mounted on the first substrate 100.

A method of connecting the drive circuit chip 300 with the first substrate 100 using the anisotropic conductive film 500 according to an embodiment will be described. First, the anisotropic conductive film 500 is formed on the output pads OPDs, and the drive circuit chip 300 is disposed on the anisotropic conductive film 500. Then, heat and pressure are applied to allow the output pads OPDs and the output bumps OPBs of the drive circuit chip 300 to be close to each other. Thus, upper portions of the conductive balls 510 may be in contact with the output bumps OPBs, and lower portions of the conductive balls 510 may be in contact with the output pads OPDs. As a result, the output pads OPDs and the output bumps OPBs may be electrically connected through the conductive balls 510.

Although there may be a problem of the output pad OPD, and additionally other components of the first substrate 100, being cracked or damaged by the aforementioned process of applying heat and pressure to the anisotropic conductive film 500, the cracks and damage may be minimized or reduced due to the aforementioned zigzag arrangement of the output pumps OPBs. The reason for this is that, when the output bumps OPBs are arranged in a zigzag form, the pressure applied to the first substrate 100 is reduced, compared to when the output bumps OPBs are arranged parallel to each other.

However, there may be a numerical limitation in the degree to which the output bumps OPB are shifted in a zigzag form. Normally, the remaining conductive balls 510 other than the conductive balls 510 electrically connecting the output bumps OPBs and the output pads OPDs may be pushed to a region other than the region where the output pads OPD and the output bumps OPBs are arranged, as heat and pressure are applied to the anisotropic conductive film 500. However, when the shifted degree of the output bumps OPB in the zigzag form is excessive, the output bumps OPBs may block the path through which the conductive balls 510 are pushed, and thus the conductive balls 510 may be arranged so as to be excessively aggregated in a specific region. In this case, there may be a possibility of the output bumps OPBs or the output pads OPDs being electrically connected to a configuration in which electrical connection is not intended, and defects may occur. That is, defects due to the conductive balls 510 included in the anisotropic conductive film 500 can be minimized or reduced by avoiding the excessive zigzag arrangements of the output bumps OPBs while appropriately adjusting the pressure applied to the first substrate 100 by the output bumps OPBs due to the zigzag arrangement of the output bumps OPB. A specific numerical range of the zigzag arrangement of the output bumps (OPB), satisfying this condition, will be described later.

The drive circuit chip 300 including the output bumps OPBs is disposed on the anisotropic conductive film 500. As described above, since the drive circuit chip 300 is directly mounted on the first substrate 100, the display device can be manufactured flexibly and further integrated. However, the present invention is not limited to the arrangement of the anisotropic conductive film 500, and an isotropic conductive film (not shown) may also be disposed.

Herein, the arrangement structure of the output bumps OPB will be described in more detail.

FIG. 6 is an enlarged layout diagram of the region "B" of FIG. 2, showing output bumps arranged.

Referring to FIG. 6, as described above, the first to fourth output bump rows OPB_R1, OPB_R2, OPB_R3, and OPB_R4 are disposed in the non-display area NDA of the first substrate 100. The respective output bumps OPB arranged in the same row may be arranged in a zigzag form to be shifted from each other. That is, among the respective output bumps OPBs arranged in the same row, odd-numbered output bumps OPBs are arranged in parallel to each other along the row direction (that is, a direction in which the first direction axis D1 extends), and even-numbered output bumps OPBs are arranged in parallel to each other along the row direction (that is, a direction in which the first direction axis D1 extends), but the odd-numbered output bumps OPBs and the even-numbered output bumps OPBs may not be arranged in parallel along the row direction (that is, a direction in which the first direction axis D1 extends).

In an embodiment, for a more detailed description of the stable mounting effect of the drive circuit chip 300 according to the detailed numerical values of the arrangement of the output bumps OPB, some numerical values will be defined regarding the arrangement of the output bumps OPB included in the first output bump row OPB_R1 of FIG. 6.

First, when an output bump OPB of two adjacent output bumps OPB disposed in the first output bump row OPB_R1 is arranged to be shifted to the upper end (that is, in a direction opposite to the direction in which the second direction axis D2 extends) in FIG. 6, the shifted length is defined as a first length dt1. Next, when two adjacent output bumps OPB disposed in the first output bump row OPB_R1 are arranged to overlap each other in the row direction (that is, a direction in which the first direction axis D1 extends) in FIG. 6, the overlapping length is defined as a second length dt2. Next, when an output bump OPB of two adjacent output bumps OPB disposed in the first output bump row OPB_R1 is arranged to be shifted to the lower end (that is, in a direction in which the second direction axis D2 extends) in FIG. 6, the shifted length is defined as a third length dt3. Next, the length between the first output bump row OPB_R1 and the second output bump row OPB_R2 is defined as a fourth length dt4. Here, the fourth length dt4 may correspond to a distance between the lower end (that is, a direction in which the second direction axis D2 extends) of the output bump OPB disposed at the lowermost end of the first output bump row OPB_R1 among the output bumps OPBs included in the first output bump row OPB_R1 in FIG. 6 and the upper end (that is, a direction opposite to the direction in which the second direction axis D2 extends) of the output bump OPB disposed at the uppermost end of the second output bump row OPB_R2 among the output bumps OPBs included in the second output bump row OPB_R2 in FIG. 6.

In an embodiment, the shapes of the output bumps OPBs included in the first through fourth output bump rows OPB_R1, OPB_R2, OPB_R3, and OPB_R4 are all the same as each other, and the first length dt1 and the third length dt3 may be equal to each other. Further, the length of one output bump OPB may be equal to the sum of the first length dt1 and the second length dt2, or the sum of the second length dt2 and the third length dt3.

As described above, defects due to the conductive balls 510 included in the anisotropic conductive film 500 can be minimized or reduced by avoiding the excessive zigzag arrangements of the output bumps OPBs while appropriately adjusting the pressure applied to the first substrate 100 by the output bumps OPBs due to the zigzag arrangement of the output bumps OPB. Referring to the following Table 1, FIG. 7 and FIG. 8, some experimental results of experimental examples for obtaining specific numerical ranges of the arrangements of the output bumps OPBs in a zigzag form, satisfying this condition, are provided.

TABLE 1

|  | Experimental Example 1 | Experimental Example 2 | Experimental Example 3 | Experimental Example 4 | Experimental Example 5 | Experimental Example 6 | Experimental Example 7 | Experimental Example 8 |
|---|---|---|---|---|---|---|---|---|
| dt1 (=dt3) | 0 μm | 0 μm | 9 μm | 9 μm | 18 μm | 18 μm | 36 μm | 36 μm |
| dt1 + dt2 (=dt2 + dt3) | 80 μm | 80 μm | 80 μm | 80 μm | 80 μm | 80 μm | 80 μm | 80 μm |
| dt4 | 48.5 μm | 43.5 μm | 48.5 μm | 43.5 μm | 48.5 μm | 43.5 μm | 48.5 μm | 43.5 μm |

Table 1 above shows the measurement conditions of Experimental Examples 1 to 8, which were measured by changing the shifted length between the adjacent output bumps OPBs arranged in the same row (that is, the first length dt1 or the third length dt3), the length of one output bump OPB in the column direction (that is, the sum of the first length dt1 and the second length dt2, or the sum of the second length dt2 and the third length dt3), and the length between the output bump rows OPB_R1, OPB_R2, OPB_R3, and OPB_R4 (that is, the fourth length dt4).

Figure 7:
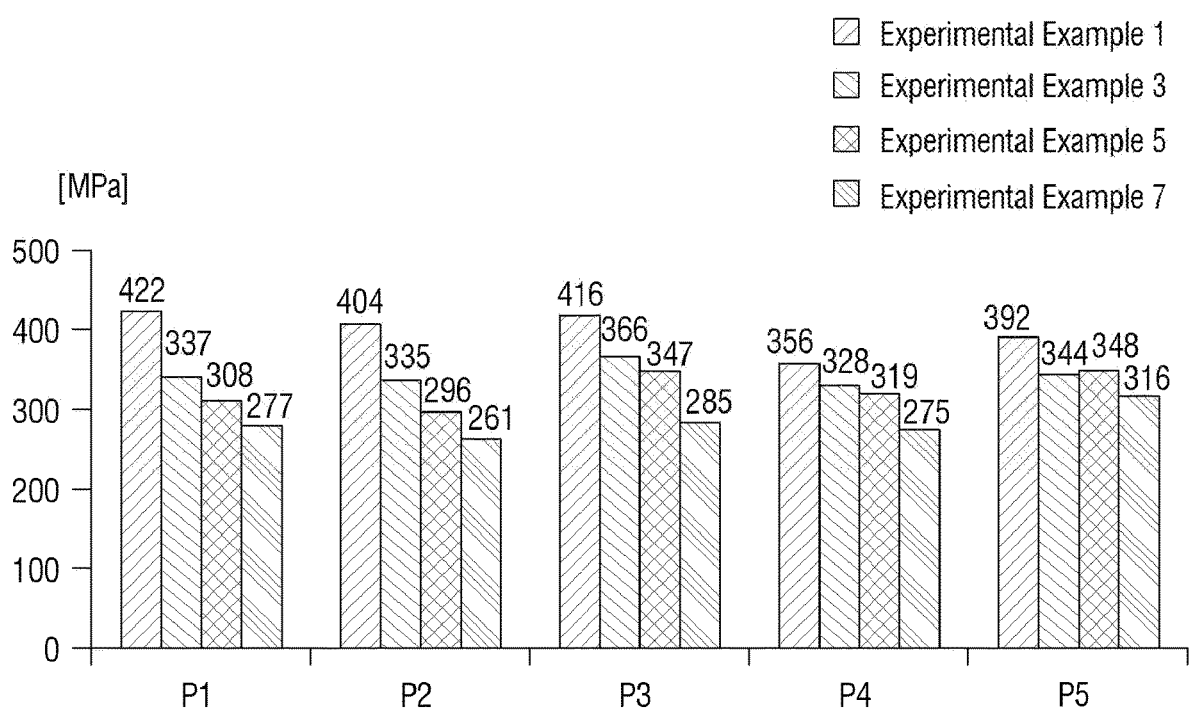
FIG. 7 is a graph showing measured values of pressures applied to first to fifth points shown in FIG. 2 in some experimental examples.
Figure 8:
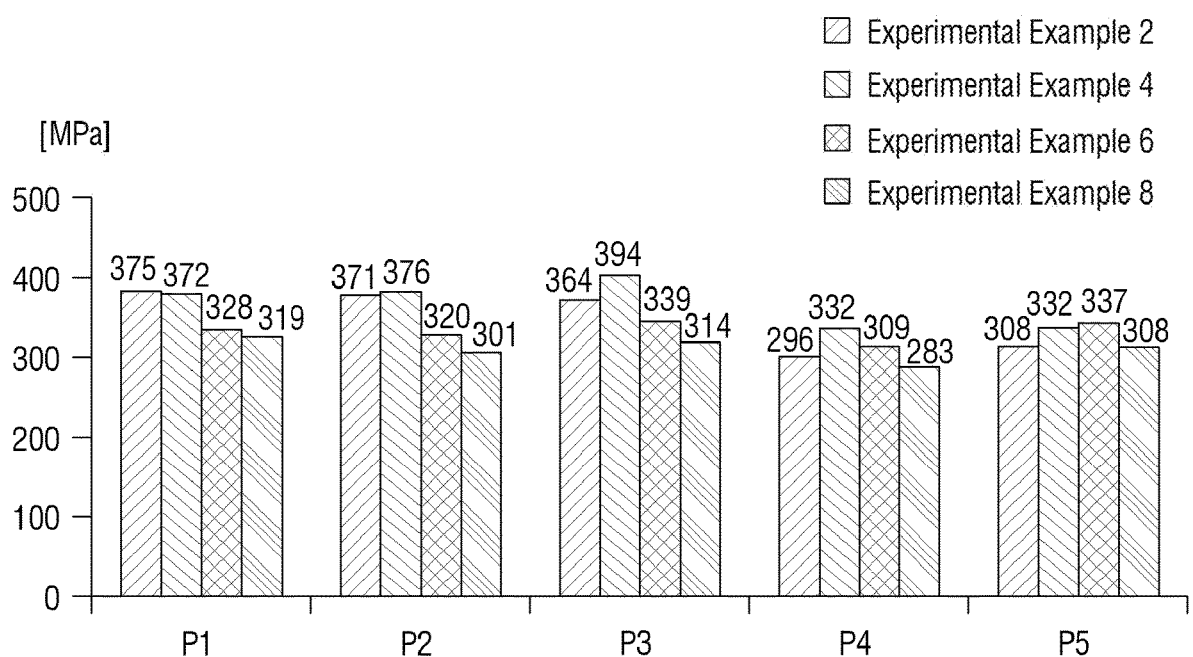
FIG. 8 is a graph showing measured values of pressures applied to the first to fifth points shown in FIG. 2 in some other experimental examples.

FIG. 7 is a graph showing the measured values of pressures applied to the first to fifth points of FIG. 2 in Experimental Examples 1, 3, 5, and 7. FIG. 8 is a graph showing the measured values of pressures applied to the first to fifth points of FIG. 2 in Experimental Examples 2, 4, 6, and 8.

In the graphs of FIGS. 7 and 8, the horizontal axis represents the values corresponding to the first to fifth points shown in FIG. 2, and the vertical axis represents the values (unit: MPa) of pressures applied to the first substrate 100 by the output bumps OPB in the process of mounting the drive circuit chip 300 on the first substrate 100, where the values were measured at the first to fifth points shown in FIG. 2.

Referring to Table 1 and FIGS. 7 and 8, it can be ascertained that, when the fourth length dt4 is 43.5 μm, the pressures applied to the first to fifth points decrease as a whole, compared to when the fourth length dt4 is 48.5 μm. Specifically, it can be ascertained that, when the output bump rows OPB_R1, OPB_R2, OPB_R3, and OPB_R4 are excessively spaced, the pressures applied to the first substrate 100 by the output bumps OPBs increases. That is, it can be ascertained that, when the output bump rows OPB_R1, OPB_R2, OPB_R3, and OPB_R4 are spaced within an appropriate numerical range, the entire region of the first substrate 100, the region being provided with the output pads OPDs, may be uniformly or substantially uniformly pressed, and thus the pressure applied to the first substrate 100 substantially decreases. In contrast, it can be ascertained that, when the output bump rows OPB_R1, OPB_R2, OPB_R3, and OPB_R4 are excessively spaced, the specific region of the first substrate 100 of the region provided with the output pads OPDs is intensively pressed, and, thus, the pressure applied to the first substrate 100 substantially increases.

Further, according to the experimental results shown in Table 1 and FIGS. 7 and 8, it can be ascertained that the pressure applied to the first substrate 100 by the output bumps OPBs decreases when the spaced distance (that is, the fourth length dt4) between adjacent output bump rows OPBRs has a value of 46 μm or less.

Next, referring to Table 1 and FIGS. 7 and 8, it can be ascertained that the pressure applied to the first substrate 100 by the output bumps OPBs decreases as the shifted length (that is, the first length dt1 or the third length dt3) of the adjacent two output bumps OPBs arranged in the same output bump row in the column direction (that is, a direction in which the second directional axis extends) is increased.

Specifically, it can be ascertained that, in the case of Experimental Example 3 or Experimental Example 4 where the first length dt1 or the third length dt3 has a value of 9 μm, the pressure applied to the first substrate 100 further decreases, compared to the case of Experimental Example 1 or Experimental Example 2 where the first length dt1 or the third length dt3 has a value of 0 μm. Further, it can be ascertained that, in the case of Experimental Example 5 or Experimental Example 6 where the first length dt1 or the third length dt3 has a value of 18 μm, the pressure applied to the first substrate 100 further decreases, compared to the case of Experimental Example 3 or Experimental Example 4 where the first length dt1 or the third length dt3 has a value of 9 μm. Further, it can be ascertained that, in the case of Experimental Example 7 or Experimental Example 8 where the first length dt1 or the third length dt3 has a value of 36 μm, the pressure applied to the first substrate 100 further decreases, compared to the case of Experimental Example 5 or Experimental Example 6 where the first length dt1 or the third length dt3 has a value of 18 μm.

However, as described above, the first length dt1 or the third length dt3 cannot infinitely increase in order to prevent defects caused by the conductive balls 510 disposed in the anisotropic conductive film 500. Specifically, the shifted length (that is, the first length dt1 or the third length dt3) of the adjacent two output bumps OPBs included in the same output bump row OPBR in the column direction (that is, a direction in which the second directional axis extends) may be half or less of the sum of the length of one output bump OPB (that is, the sum of the first length dt1 and the second length dt2 or the sum of the second length dt2 and the third length dt3) and the spaced length between two consecutive output bump rows OPBR (that is, the fourth length dt4).

That is, $dt1$ and $dt3 \leq (dt1+dt2+dt4)/2$ ... Equation (1) or $dt1$ and $dt3 \leq (dt2+dt3+dt4)/2$ ... Equation (2) may be satisfied.

Only when the conditions of the aforementioned Equation (1) or (2) are satisfied, the anisotropic conductive film 500 can be smoothly deformed in the process of applying heat and pressure to the anisotropic conductive film 500 disposed on the first substrate 100.

Consequently, although the pressure applied to the first substrate 100 by the output bumps OPBs decreases when the first length dt1 or the third length dt3 has a long value, defects due to the conductive balls 510 may occur when the first length dt1 or the third length dt3 has an excessively long value. Therefore, the first length dt1 or the third length dt3 may be determined within a range that satisfies the conditions of Equation (1) or (2).

However, among the aforementioned contents, 46 μm described as the standard of the length of the fourth length dt4 is a length derived according to the present experimental conditions, and this value may also be changed. That is, this value is only a resultant value derived according to the structure of the output bump (OPB) and the output pad (OPD) under the experimental conditions. The specific numerical value range of the fourth length dt4 is not limited to the numerical value described in the present embodiment, and may be changed as necessary, provided that the range of Equation (1) or (2) is satisfied.

Cracks and damage due to the pressure of the aforementioned output bumps OPBs to the first substrate may more easily occur in the case of a flexible substrate. In this case, the structure according to the present invention is further required. Herein, a specific structure of a flexible substrate will be described.

Figure 9:
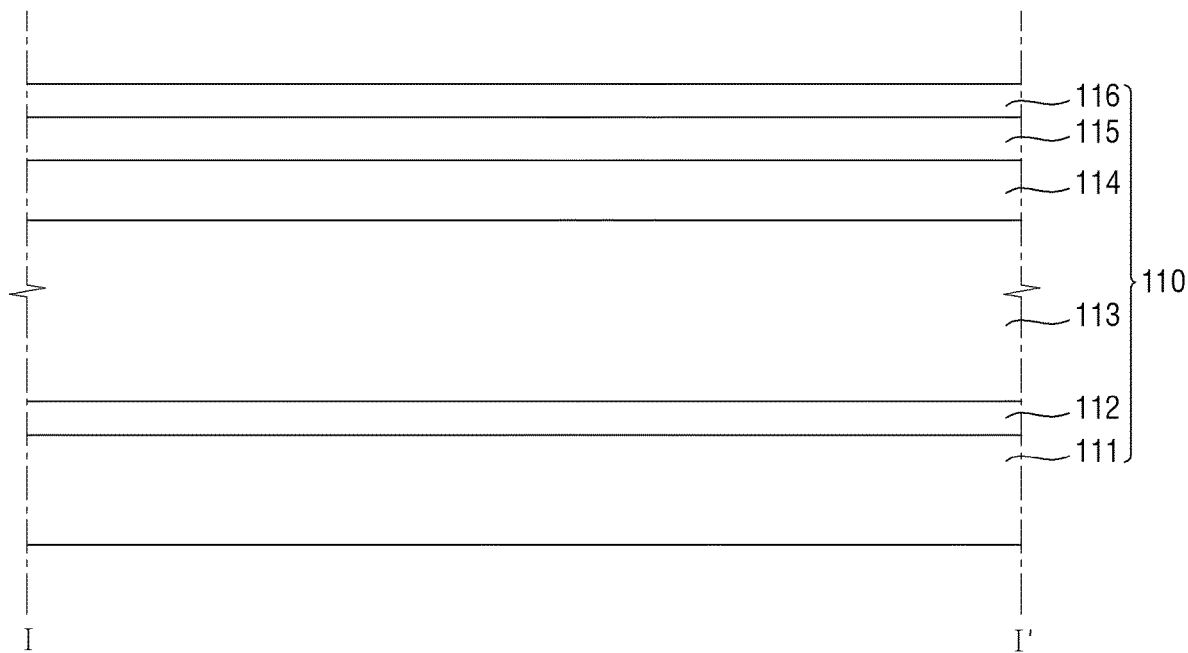
FIG. 9 is a sectional view of a base substrate of the display device of FIGS. 4 and 5, where the base substrate is a flexible substrate, according to an embodiment of the present invention.

FIG. 9 is a sectional view of a base substrate of the display device of FIGS. 4 and 5, where the base substrate is a flexible substrate, according to an embodiment of the present invention.

Referring to FIG. 9, in an embodiment, the base substrate 110 has a lamination structure of a first plastic film layer 111, a first adhesive layer 112, a second plastic film layer 113, a second adhesive layer 114, a third plastic film layer 115, and a fourth plastic film layer 116.

The first plastic film layer 111 is made of a polymer material having excellent heat resistance, such as polyethylene terephthalate (PET). The first plastic film layer 111, as shown in FIG. 9, can protect the components disposed on the front surface (that is, an upper portion) of the first plastic film layer 111 from the impact applied to the back surface (that is, a lower portion) of the first plastic film layer 111, and may have a strength that is bent to a certain degree. In addition, the first plastic film layer 111 may provide restoring force to relieve bending after bending.

The first adhesive layer 112 is disposed on one surface of the first plastic film layer 111. The first adhesive layer 112 may be made of a pressure-sensitive adhesive (PSA). The pressure-sensitive adhesive refers to an adhesive to which an adhesive material acts when pressure is applied to bond the adhesive to an adhesive surface. No solvent, water, or heat is required to activate the adhesive. As suggested in the name "pressure-sensitive," the strength of adhesion is influenced by the amount of pressure that causes the adhesive to be applied to a surface. The pressure-sensitive adhesive can usually maintain appropriate adhesiveness and sustainability at room temperature.

The second plastic film layer 113 is disposed on one surface of the first adhesive layer 112. The second plastic film layer 113, similarly to the first plastic film layer 111, is made of a polymer material having excellent heat resistance, such as polyethylene terephthalate (PET). The second plastic film layer 113 may be thicker than the first plastic film layer 111, and may function to allow the base substrate 110 to be bent to an appropriate strength without being excessively bent.

The second adhesive layer 114 is disposed on one surface of the second plastic film layer 113. The second adhesive layer 114, similarly to the first adhesive layer 112, may be made of a pressure-sensitive adhesive (PSA), and may perform the same function as the first adhesive layer 112.

The third plastic film layer 115 and the fourth plastic film layer 116 are sequentially disposed or stacked on one surface of the second adhesive layer 114. Each of the third plastic film layer 115 and the fourth plastic film layer 116 is made of a polymer material having excellent heat resistance, such as polyimide (PI). The third plastic film layer 115 and the fourth plastic film layer 116 may be thinner than the first adhesive layer 112 and the second plastic film layer 113.

In an embodiment, due to the lamination structure of the base substrate 110, the base substrate 110 can have appropriate bending strength, and a display device having flexible characteristics can be manufactured. However, unlike the structure of the base substrate 110 of a general display device which is not bent, the base substrate 110 according to the present embodiment includes a plurality of adhesive layers, and thus relatively larger thickness deformation may be caused when pressure is applied to the first substrate 100 by the output bumps OPBs of the drive circuit chip 300. Accordingly, cracks and damage of the output pads OPD and the like may occur relatively easily. However, when the arrangement structure of the output bumps OPBs according to one or more embodiments of the present invention is used, cracks or damage of the output pads OPDs and the like can be minimized or reduced, and the drive circuit chip 300 can be stably mounted on the first substrate 100.

Figure 10:
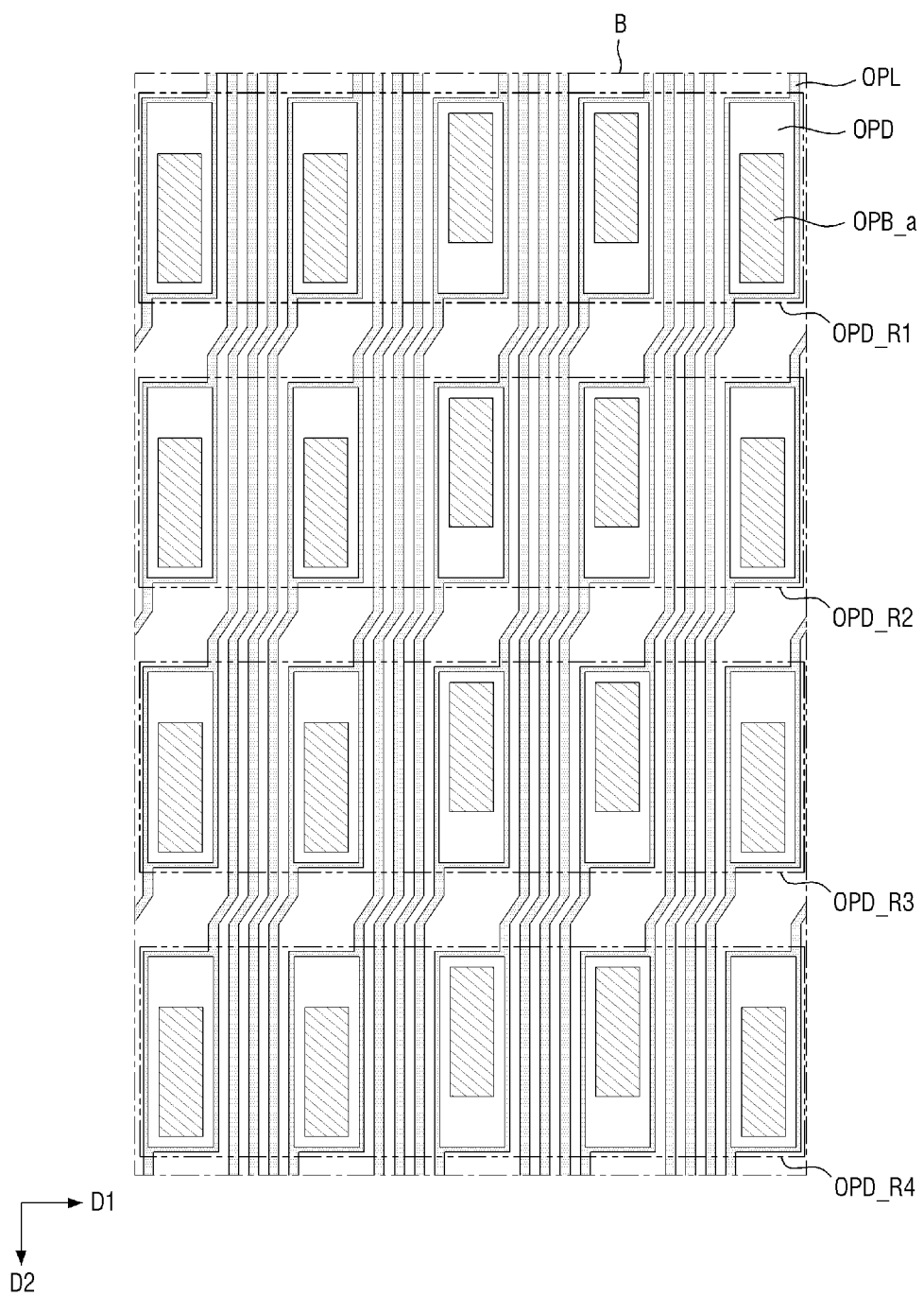
FIG. 10 is an enlarged layout diagram of a region corresponding to the region "B" of FIG. 2 of a display device according to a modified embodiment of the present invention.
Figure 11:
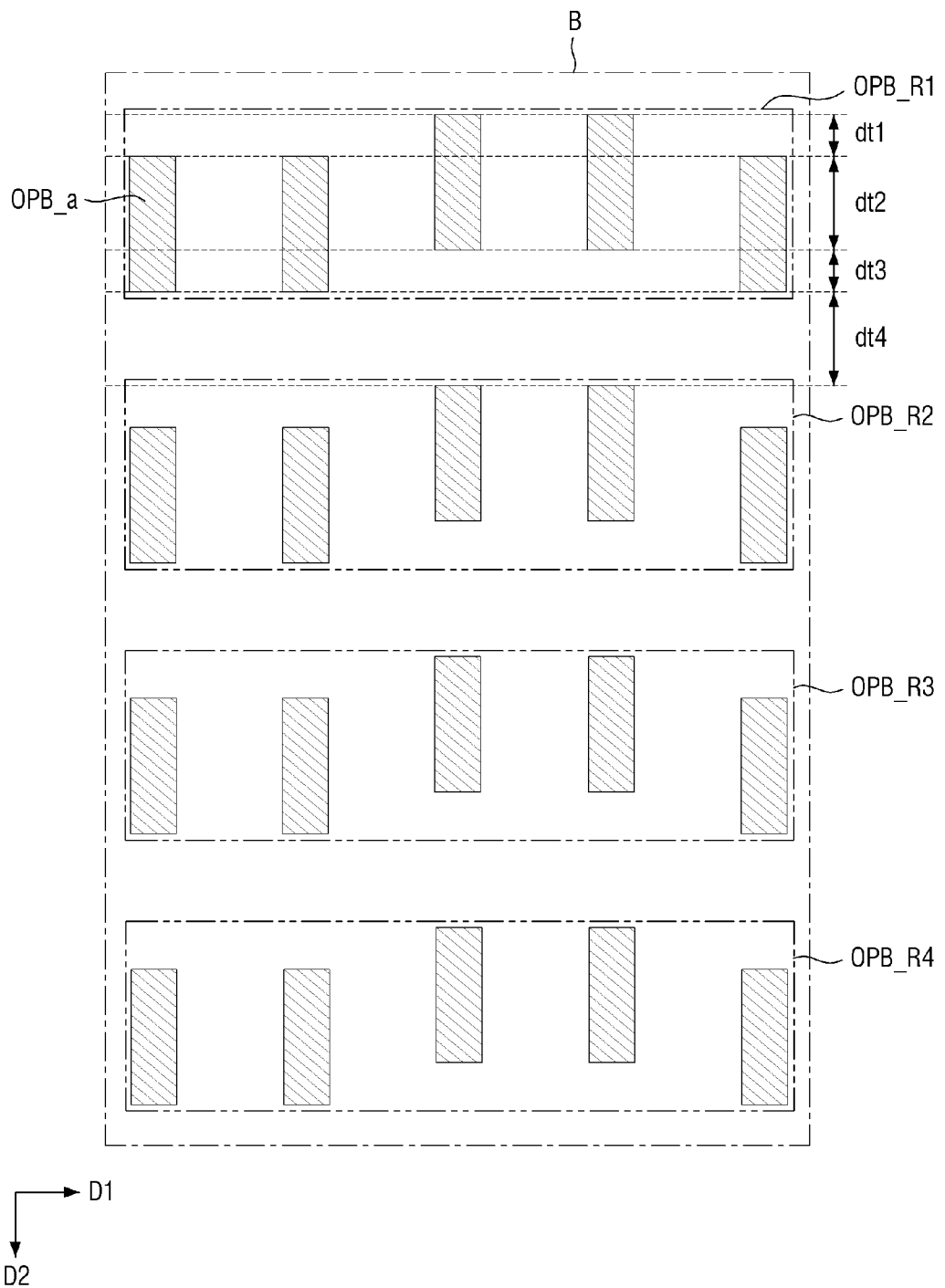
FIG. 11 is an enlarged layout diagram showing output bumps arranged in the region shown in FIG. 10.

FIG. 10 is an enlarged layout diagram of a region corresponding to the region "B" of FIG. 2 of a display device according to a modified embodiment of the present invention; and FIG. 11 is an enlarged layout diagram showing output bumps arranged in the region shown in FIG. 10.

The display device according to a modified embodiment of the present invention has some differences in the arrangement of output bumps OPB_a, compared with the display device according to the embodiment shown in FIGS. 2 and 6. Therefore, a description of the components denoted by the same reference numerals will be omitted, and differences will be mainly described.

Referring to FIGS. 10 and 11, the display device according to a modified embodiment of the present invention includes first to fourth output bump rows OPB_R1, OPB_R2, OPB_R3, and OPB_R4 in the region corresponding to the region "B" of FIG. 2. However, the output bumps OPB_a respectively disposed in the first to fourth output bump rows OPB_R1, OPB_R2, OPB_R3, and OPB_R4 may be arranged in a zigzag form in a bundle of two output bumps. That is, in the case of the display device according to an embodiment of the present invention shown in FIGS. 2 and 6, the output bumps (OPBs of FIG. 6) arranged in the same output bump rows OPB_R1, OPB_R2, OPB_R3 and OPB_R4 are arranged between the most adjacent output bumps (OPBs of FIG. 6) in a zigzag form, but may differ from the structure thereof. Further, although not shown, the output bumps OPB_a disposed in the same output bump rows OPB_R1, OPB_R2, OPB_R3, and OPB_R4 may also be arranged a zigzag form in a bundle of three or more output bumps.

In an embodiment, some of the arranged output pads OPDs may be output pads OPDs used for testing, which function as a path through which a test signal (not shown) is inputted from the outside before attaching the drive circuit chip (300 of FIG. 1) and which remain not to perform a separate role after attaching the drive circuit chip (300 of FIG. 1). The output pads OPDs used for testing may be the output pads OPDs disposed outside. For example, the output pads OPDs disposed in the first column of each of the first to fourth output pad rows OPD_R1, OPD_R2, OPD_R3, and OPD_R4 may be output pads OPDs used for testing. In contrast, the output pads OPDs disposed in the last column of each of the first to fourth output pad rows OPD_R1, OPD_R2, OPD_R3, and OPD_R4 may be output pads OPDs used for testing.

In addition, when some of the output pads OPD are output pads OPD mainly used for testing, the pad lines OPLs electrically connected to these output pads OPD may also be pad lines OPLs used for testing.

Figure 12:
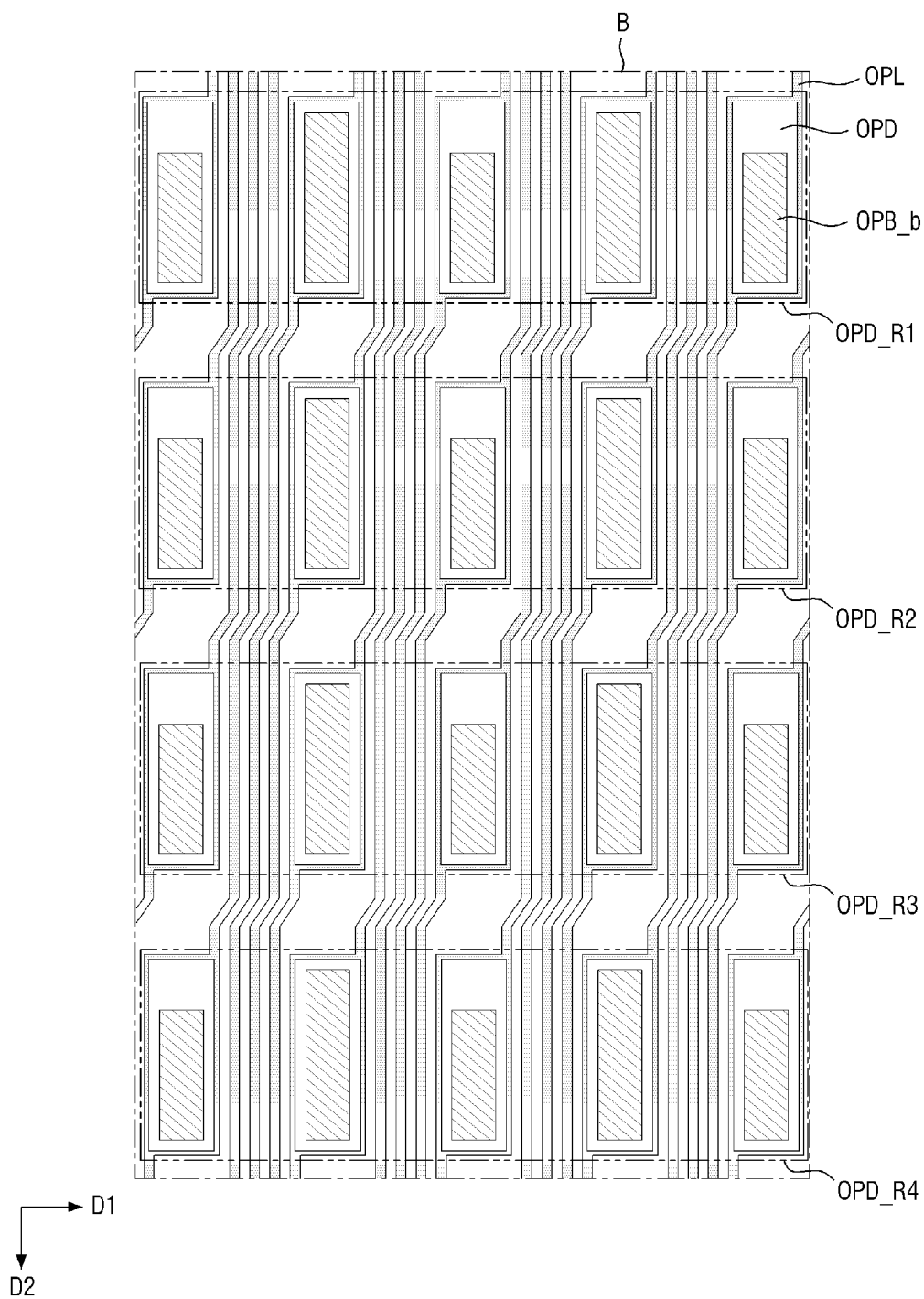
FIG. 12 is an enlarged layout diagram of a region corresponding to the region "B" of FIG. 2 of a display device according to another modified embodiment of the present invention.
Figure 13:
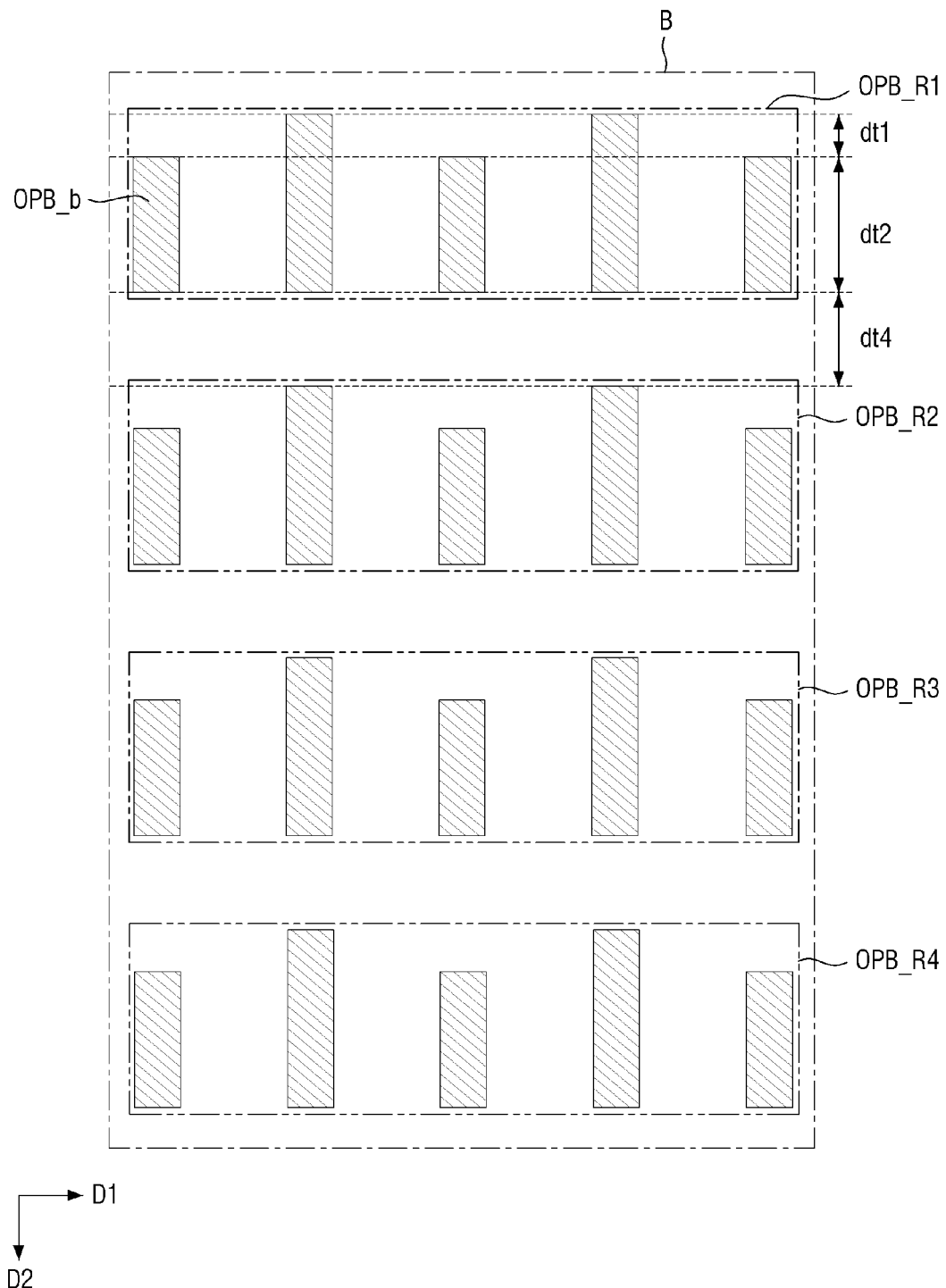
FIG. 13 is an enlarged layout diagram showing output bumps arranged in the region shown in FIG. 12.

FIG. 12 is an enlarged layout diagram of a region corresponding to the region "B" of FIG. 2 of a display device according to another modified embodiment of the present invention; and FIG. 13 is an enlarged layout diagram showing output bumps arranged in the region shown in FIG. 12.

The display device according to another modified embodiment of the present invention has some differences in the arrangement of output bumps OPB_b, compared with the display device according to the embodiment shown in FIGS. 2 and 6. Therefore, a description of the components denoted by the same reference numerals will be omitted, and differences will be mainly described.

Referring to FIGS. 12 and 13, the display device according to another modified embodiment of the present invention includes first to fourth output bump rows OPB_R1, OPB_R2, OPB_R3, and OPB_R4 in the region corresponding to the region "B" of FIG. 2.

The upper ends of the output bumps OPB_b disposed in each of the first to fourth output bump rows OPB_R1, OPB_R2, OPB_R3, and OPB_R4 (here, the upper end refers to the end disposed in the upward direction of FIGS. 12 and 13, that is, the end disposed in the direction opposite the direction in which the second directional axis D2 extends) may be arranged in a zigzag form, whereas the lower ends of the output bumps OPB_b (here, the lower end refers to the end disposed in the downward direction of FIGS. 12 and 13, that is, the end disposed in the direction in which the second directional axis D2 extends) may be arranged in parallel.

Due to such a structure, a degree to which the output bumps OPB_b are arranged in a zigzag form is relatively relieved compared with the output bumps (OPBs of FIGS. 2 and 6) of the display device according to the embodiment shown in FIGS. 2 and 6, so as to minimize or reduce the occurrence of defects due to the anisotropic conductive film 500.

Figure 14:
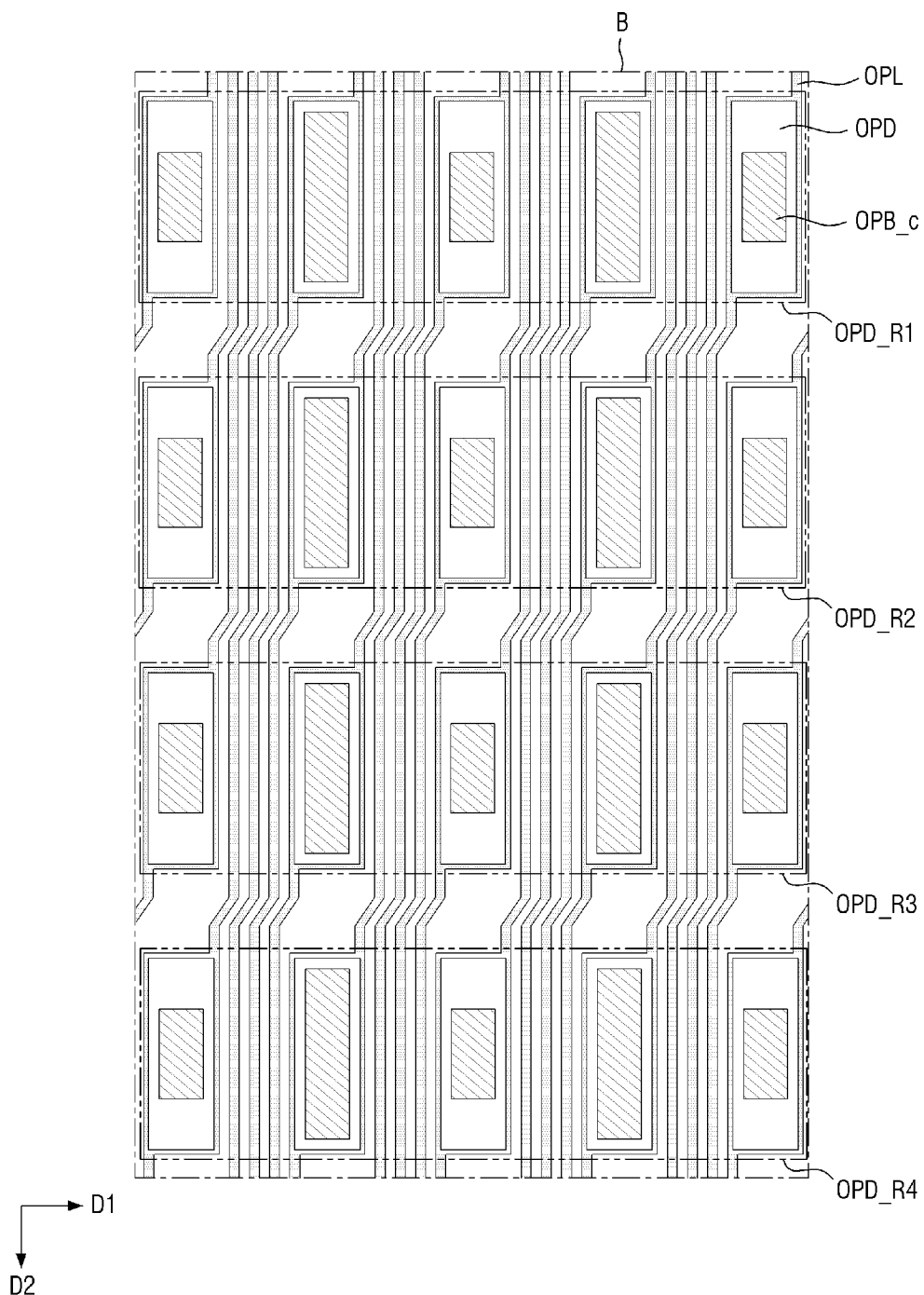
FIG. 14 is an enlarged layout diagram of a region corresponding to the region "B" of FIG. 2 of a display device according to another modified embodiment of the present invention.
Figure 15:
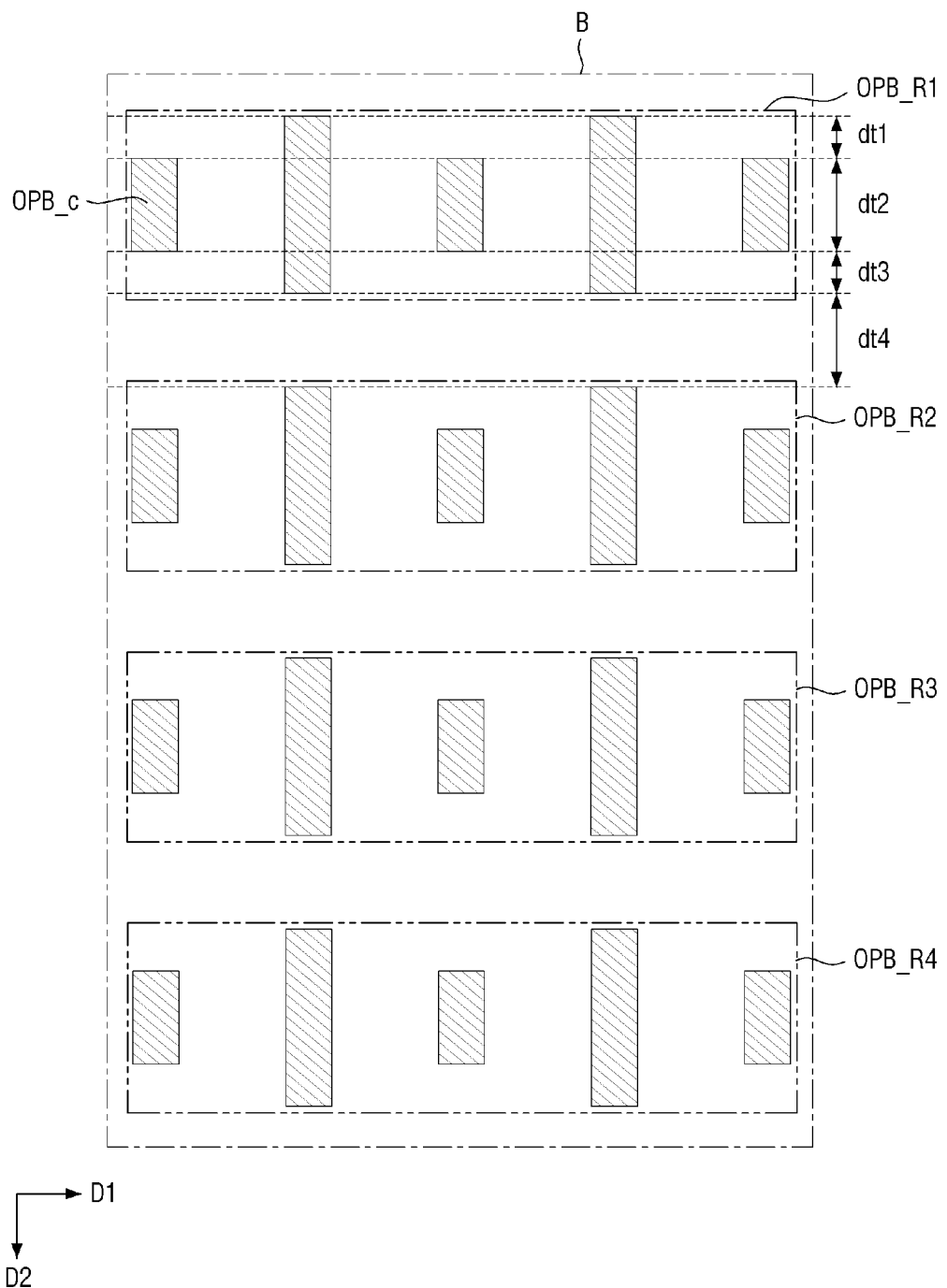
FIG. 15 is an enlarged layout diagram showing output bumps arranged in the region shown in FIG. 14.

FIG. 14 is an enlarged layout diagram of a region corresponding to the region "B" of FIG. 2 of a display device according to another modified embodiment of the present invention; and FIG. 15 is an enlarged layout diagram showing output bumps arranged in the region shown in FIG. 14.

The display device according to another modified embodiment of the present invention has some differences in the structure of output bumps OPB_c, compared with the display device according to the embodiment shown in FIGS. 2 and 6. Therefore, a description of the components denoted by the same reference numerals will be omitted, and differences will be mainly described.

Referring to FIGS. 14 and 15, the display device according to another modified embodiment of the present invention includes first to fourth output bump rows OPB_R1, OPB_R2, OPB_R3, and OPB_R4 in the region corresponding to the region "B" of FIG. 2.

The output bumps OPB_c arranged in each of the first to fourth output bump rows OPB_R1, OPB_R2, OPB_R3, and OPB_R4 may have different shapes between adjacent output bumps OPB_c. In an embodiment, among the respective output bumps OPB_c arranged in the first output bump row OPB_R1, a length (that is, a sum of a first length dt1, a second length dt2 and a third length dt3) in the column direction (that is, a direction in which the second directional axis D2 extends) of even-numbered output bumps OPB may be longer than a length (that is, the second length dt2) extending in the column direction (that is, a direction in which the second directional axis D2 extends) of odd-numbered output bumps OPB_c. In an embodiment (not shown), in contrast to the first output bump row OPB_R1, among the respective output bumps OPB_c arranged in the second output bump row OPB_R2, the length in the column direction (that is, a direction in which the second directional axis D2 extends) of the even-numbered output bumps OPB may be shorter than the length extending in the column direction (that is, a direction in which the second directional axis D2 extends) of the odd-numbered output bumps OPB_c. The third output bump row OPB_R3 and the fourth output bump row OPB_R4 may have the same arrangement as the first output bump row OPB_R1 and the second output bump row OPB_R2, respectively.

Due to this structure, even if the shapes of the output bumps OPB_c adjacent to each other are different, a zigzag arrangement structure can be maintained.

Figure 16:
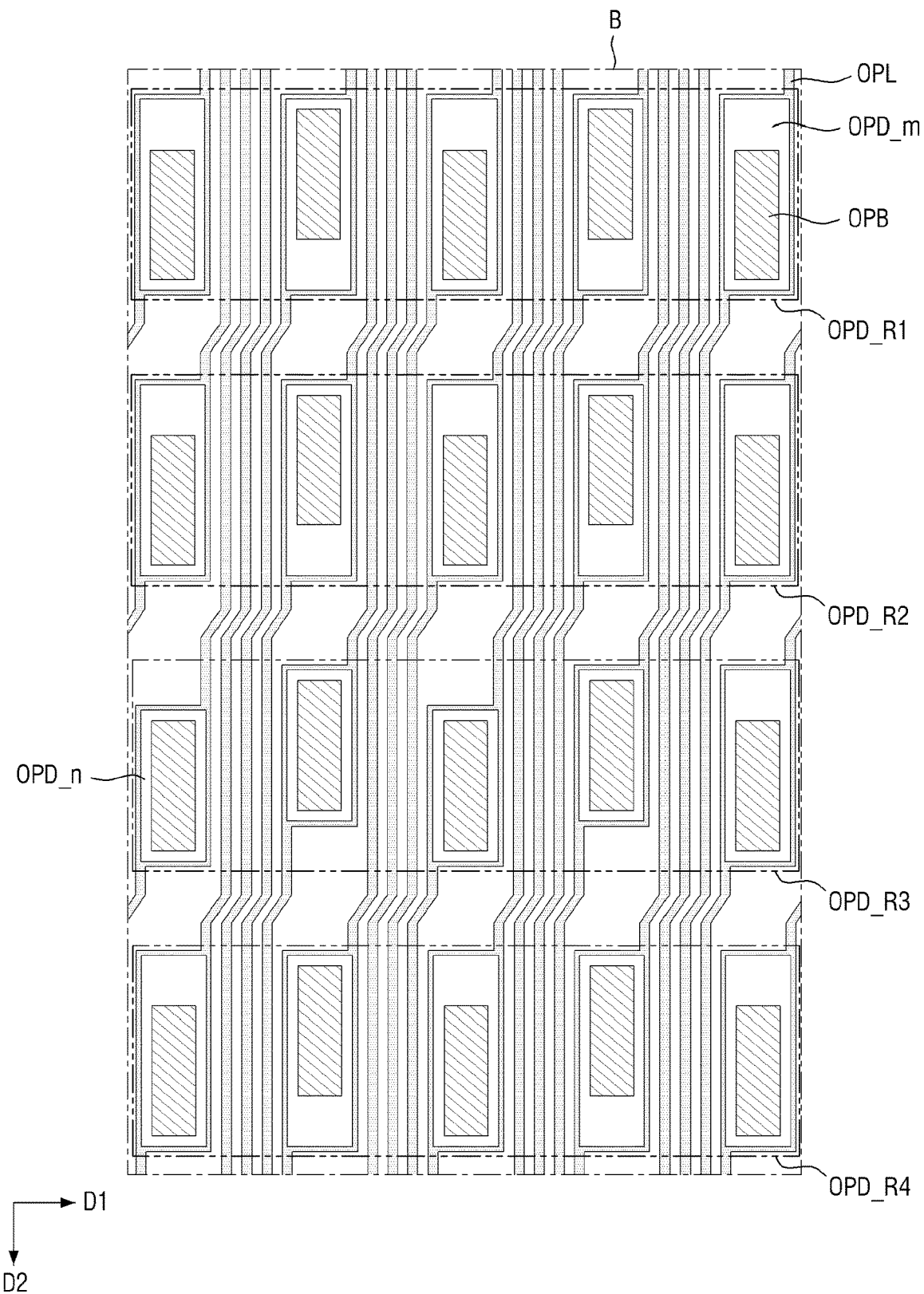
FIG. 16 is an enlarged layout diagram of a region corresponding to the region "B" of FIG. 2 of a display device according to another modified embodiment of the present invention.

FIG. 16 is an enlarged layout diagram of a region corresponding to the region "B" of FIG. 2 of a display device according to another modified embodiment of the present invention.

The display device according to another modified embodiment of the present invention is different from the display device according to the embodiment shown in FIG. 2 in that the shapes of some output pads OPD_n are different from the shapes of other output pads OPD_m. Therefore, a description of the components denoted by the same reference numerals will be omitted, and differences will be mainly described.

Referring to FIG. 16, the display device according to another modified embodiment of the present invention includes first to fourth output pad rows OPD_R1, OPD_R2, OPD_R3, and OPD_R4 in the region corresponding to the region "B". Further, drive output pads OPD_m or inspection output pads OPD_n are arranged in each of the first to fourth output pad rows OPD_R1, OPD_R2, OPD_R3, and OPD_R4.

The drive output pads OPD_m perform a function of transmitting a drive signal. The respective drive output pads OPD_m arranged in the same row may be formed to have the same shape, and may be arranged parallel to each other. The drive output pads OPD_m disposed in the display device according to an embodiment of the present invention may have the same shape as the output pads (OPD of FIGS. 2 and 6) disposed in the display device according to the embodiment shown in FIG. 2, and may perform the same function as the output pads (OPD of FIGS. 2 and 6).

The inspection output pads OPD_n serve to check whether the drive circuit chip 300 is normally mounted on the first substrate 100 without misalignment. The inspection output pads OPD_n may be arranged in a very small number between the plurality of drive output pads OPD_m, and may have a relatively small size compared with the drive output pads OPD_m.

In an embodiment, a width of the inspection output pad OPD_n in the row direction (that is, a direction in which the first directional axis D1 extends) may be equal to a width of the drive output pad OPD_m in the row direction (that is, a direction in which the first directional axis D1 extends). In contrast, a length of the inspection output pad OPD_n in the column direction (that is, a direction in which the second directional axis D2 extends) may be shorter the length of the drive output pad OPD_m in the column direction (that is, a direction in which the second directional axis D2 extends). In an embodiment, the inspection output pad OPD_n may be formed in a similar shape to the output bump OPB disposed corresponding thereto, and may be disposed at the same position.

In an embodiment, as shown in FIG. 16, the inspection output pad OPD_n may extend to a shorter length than the output pad OPD_m disposed corresponding thereto. That is, the length of the inspection output pad OPD_n extending in the column direction (that is, a direction in which the second directional axis D2 extends) may be shorter than the length of the output pad OPD_m extending in the column direction (that is, a direction in which the second directional axis D2 extends).

A method for checking whether the drive circuit chip 300 is misaligned using the inspection output pads OPD_n according to an embodiment will be described. First, the drive circuit chip 300 is mounted, and then the drive circuit chip 300 provides a test signal to the inspection output pads OPD_n. Then, the voltage of the test signal is measured from the inspection output pads OPD_n arranged on the first substrate 100. If misalignment of the drive circuit chip 300 does not occur, the voltage of the test signal detected from the first substrate 100 may be close to a preset reference value, but, if misalignment of the drive circuit chip 300 occurs, the voltage of the test signal detected from the first substrate 100 may not reach the preset reference value. The reason for this is that if the misalignment of the drive circuit chip 300 occurs, the overlapping area of the inspection output pad OPD_n and the output bump OPB may become small because the inspection output pad OPD_n and the output bump OPB disposed corresponding thereto are formed in the same shape and arranged at the same position.

FIGS. 17 to 21 are enlarged layout diagrams respectively showing output bumps of display devices arranged in regions corresponding to the region "B" of FIG. 2, according to other modified embodiments of the present invention.

Each of the display devices according to the other modified embodiments of the present invention is different from the display device according to the embodiment shown in FIG. 2 in the shape of output bumps OPB_e, OPB_f, OPB_g, OPB_h, and OPB_i. Therefore, a description of the components denoted by the same reference numerals will be omitted, and differences will be mainly described.

Figure 17:
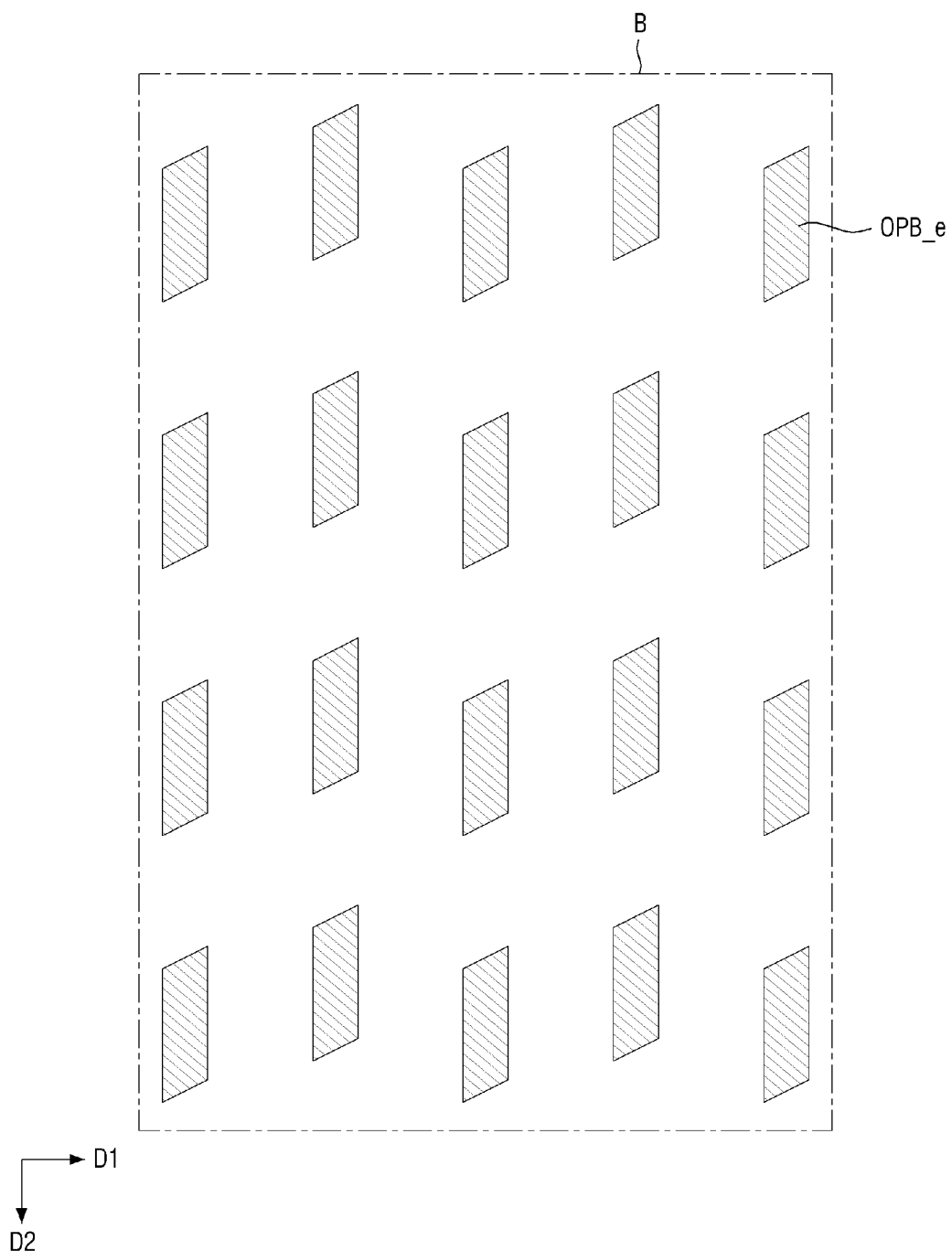
FIGS. 17 to 21 are enlarged layout diagrams respectively showing output bumps of display devices arranged in regions corresponding to the region "B" of FIG. 2, according to other modified embodiments of the present invention.
Figure 18:
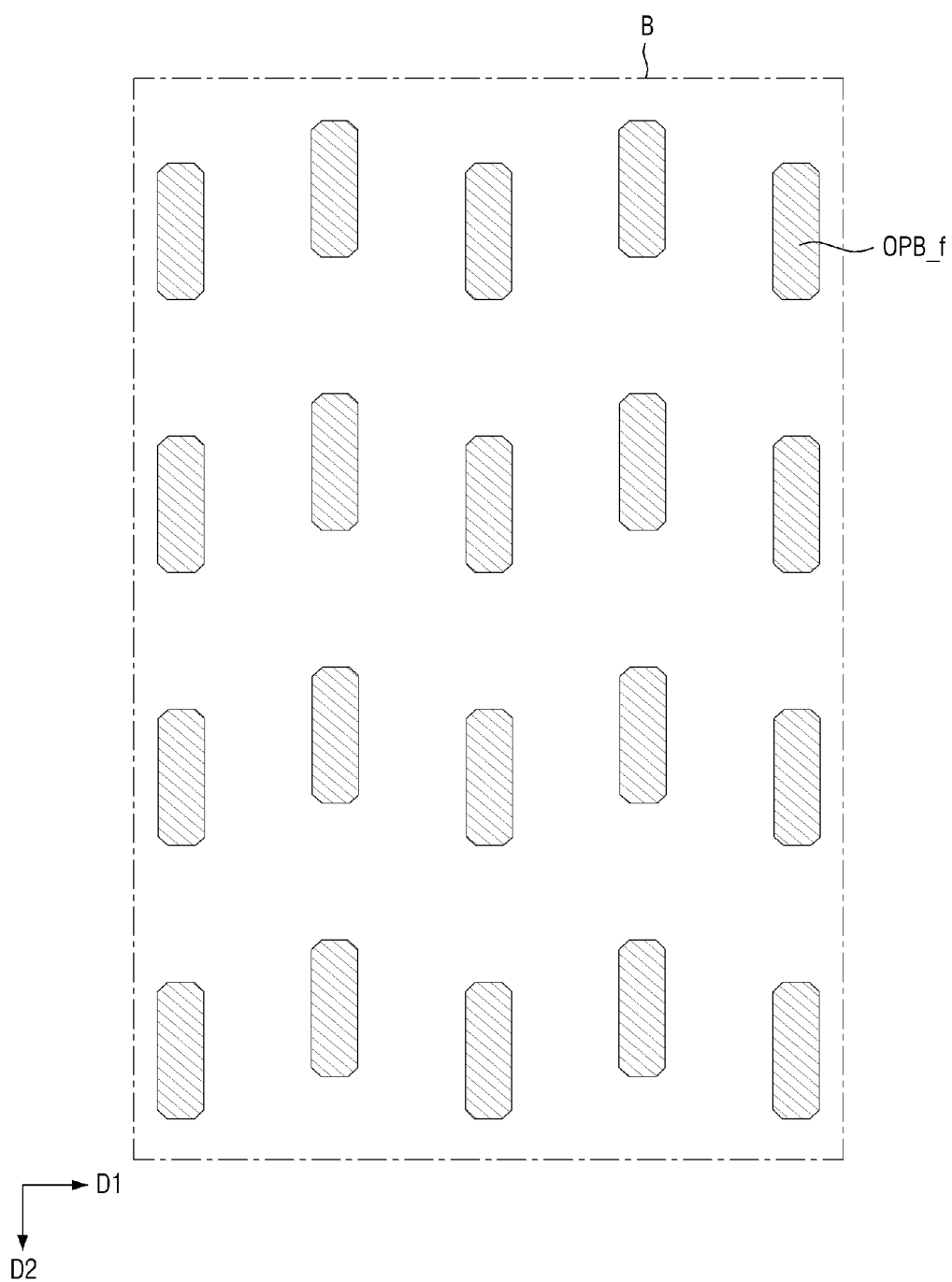
Figure 19:
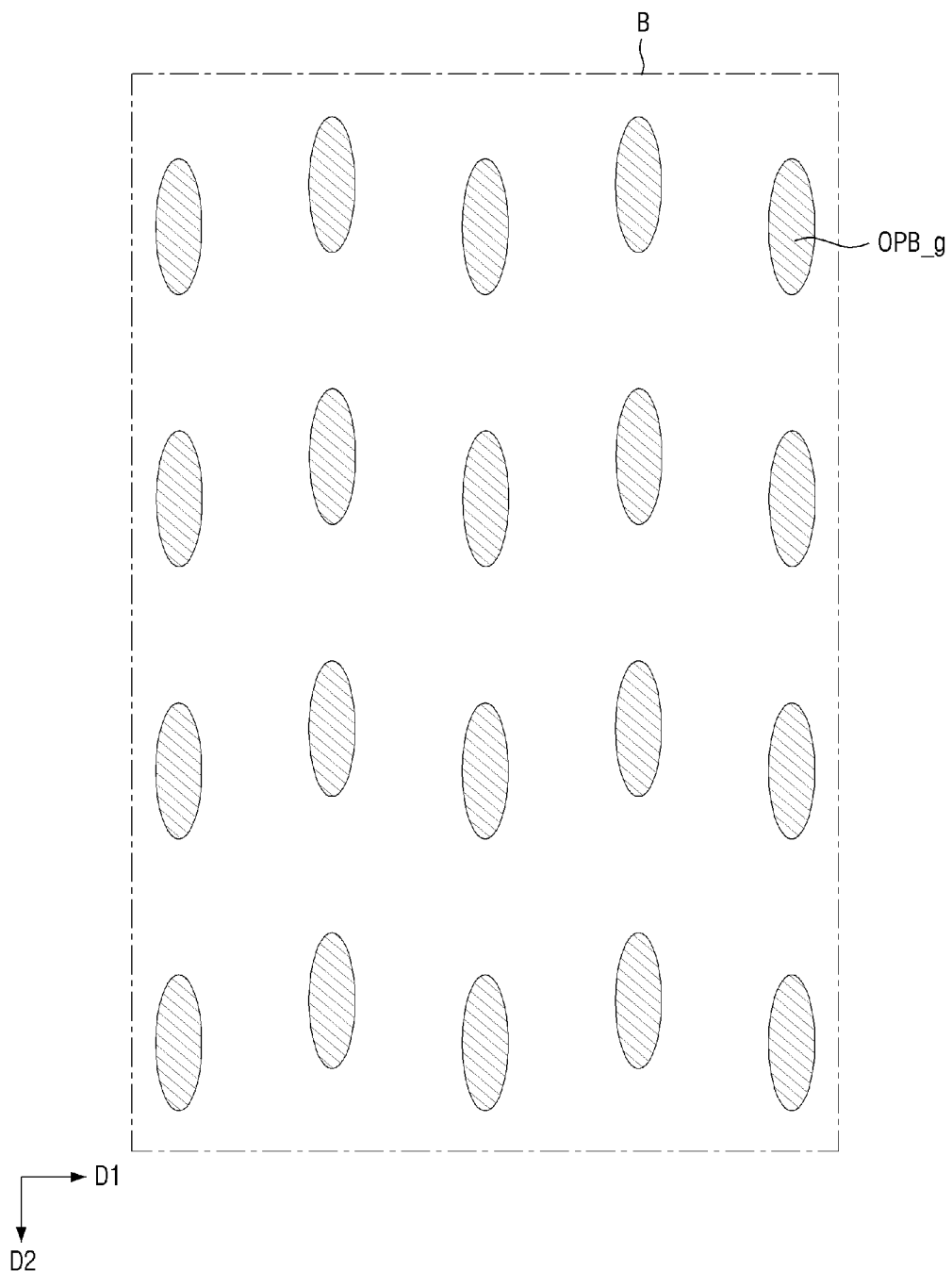
Figure 20:
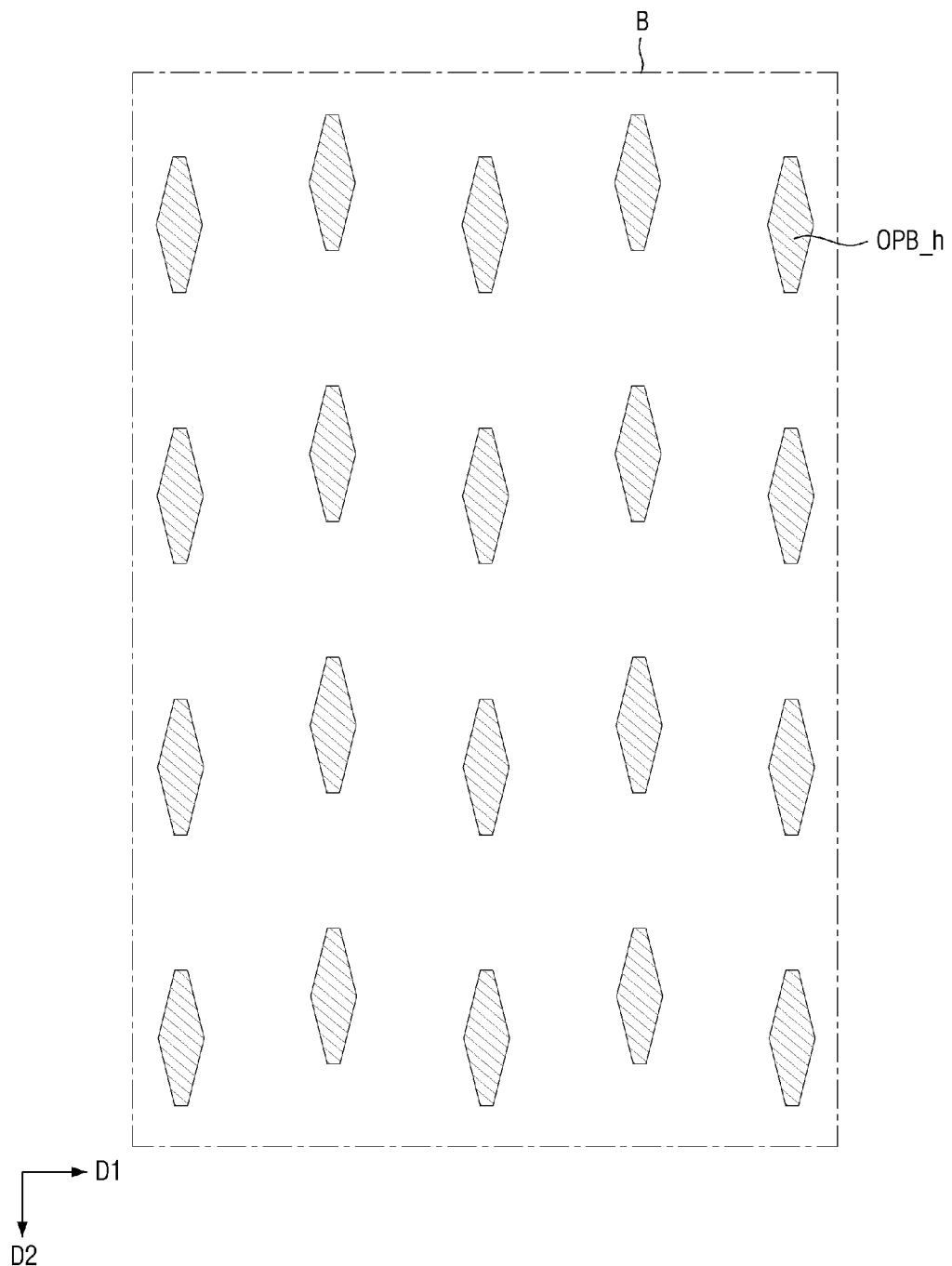

Referring to FIG. 17, a display device according to another modified embodiment of the present invention includes output bumps OPB_e having a parallelogram shape. Further, referring to FIG. 18, a display device according to another modified embodiment of the present invention includes output bumps OPB_f having a rectangular shape with ends where adjacent sides meet each other being cut off, or chamfered. Further, referring to FIG. 19, a display device according to another modified embodiment of the present invention includes output bumps OPB_g having an elliptical shape. Further, referring to FIG. 20, a display device according to another modified embodiment of the present invention includes output bumps OPB_h having a diamond shape with upper and lower ends are cut off.

Figure 21:
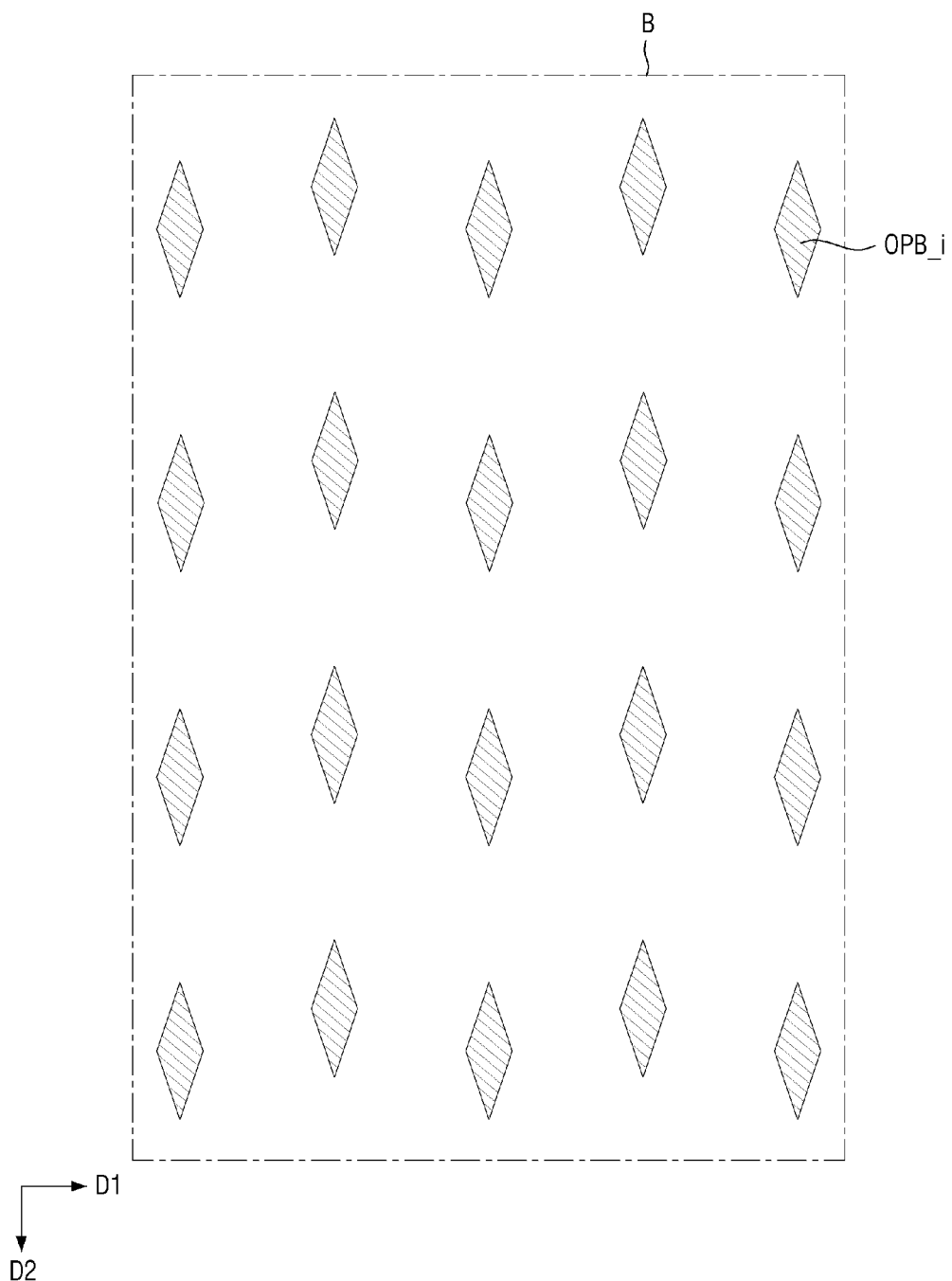

Further, referring to FIG. 21, a display device according to another modified embodiment of the present invention includes output bumps OPB_i having a diamond shape.

In one or more embodiments, if the respective output pads arranged on the first substrate 100 satisfy the conditions having the same shape as each other, the shape of the output bumps OPB can be variously designed. Accordingly, when heat and pressure are applied to the anisotropic conductive film 500 in the process of connecting the drive circuit chip 300, the flow of the conductive balls 510 not in contact with the output bumps OPB or the output pads OPD may be changed depending on the shape of the output bumps OPB, and design freedom may be increased in consideration of this phenomenon.

Figure 22:
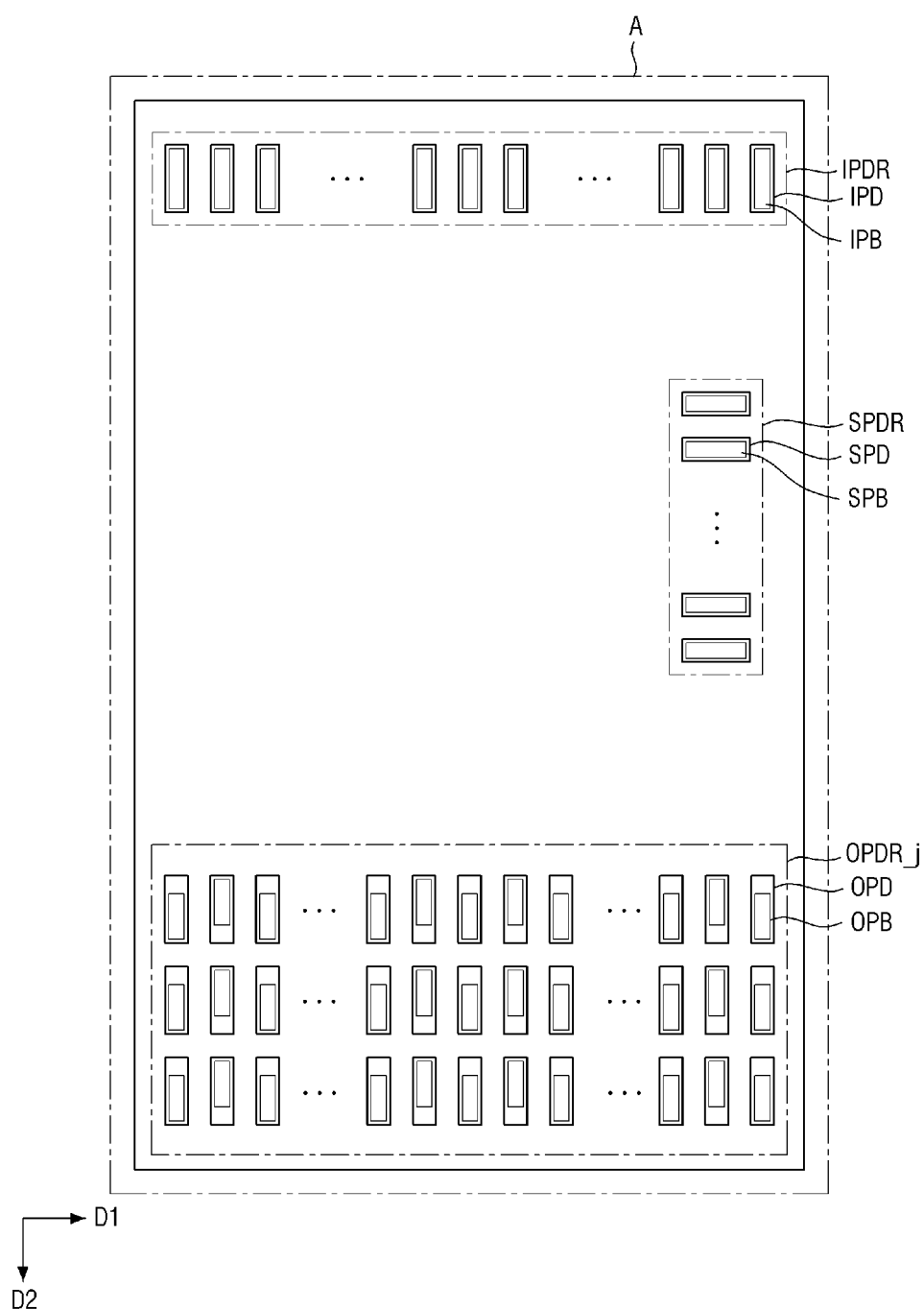
FIG. 22 is a layout view showing bumps and pads of a display device arranged in a region corresponding to the region "A" of FIG. 1, according to another modified embodiment of the present invention.

FIG. 22 is a layout view showing bumps and pads of a display device arranged in a region corresponding to the region "A" of FIG. 1, according to another modified embodiment of the present invention.

The display device according to another modified embodiment of the present invention is different from the display device according to the embodiment shown in FIG. 2 in that the number of rows formed by the output pads OPD is relatively decreased. Therefore, a description of the components denoted by the same reference numerals will be omitted, and differences will be mainly described.

Referring to FIG. 22, the first substrate 100 of the display device according to another modified embodiment of the present invention includes an input pad region IPDR, a side pad region SPDR, and an output pad region OPDR_j.

A plurality of input pads IPD may be arranged in the input pad region IPDR, and a plurality of side pads SPD may be arranged in the side pad region SPDR. Since, in an embodiment, the input pad region IPDR and the side pad region SPDR may be the same as those having been described with reference to FIG. 2, the description thereof will be omitted.

A plurality of output pads OPD are arranged in the output pad region OPDR_j, and may be arranged to form a total of three rows. That is, like the display device according to the embodiment shown in FIG. 2, the output pad region (OPDR of FIG. 2) is not limited to the arrangement of output pads OPD of four rows, and may also be provided with output pads OPD of three rows. Further, although not shown in the drawings, the number of rows of the output pads OPD disposed in the output pad region OPDR_j is not limited to four or three, and may also be two or less or five or more.

Figure 23:
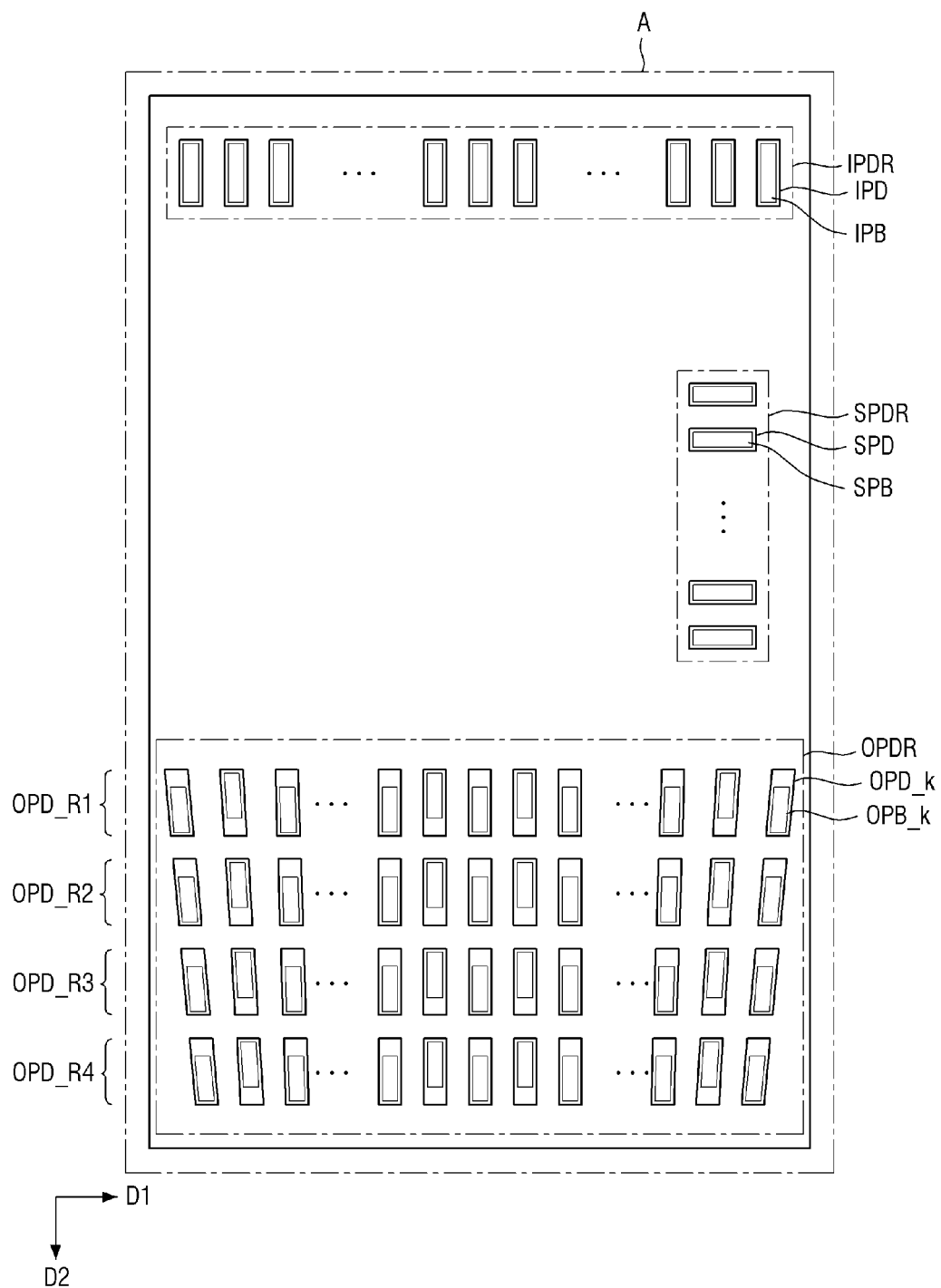
FIG. 23 is a layout view showing bumps and pads of a display device arranged in a region corresponding to the region "A" of FIG. 1, according to another modified embodiment of the present invention.

FIG. 23 is a layout view showing bumps and pads of a display device arranged in a region corresponding to the region "A" of FIG. 1, according to another modified embodiment of the present invention.

The display device according to another modified embodiment of the present invention is different from the display device according to the embodiment shown in FIG. 2 in that output pads OPD_k and output bumps OPB_k are formed so as to face in different directions. Therefore, a description of the components denoted by the same reference numerals will be omitted, and differences will be mainly described.

Referring to FIG. 23, the first substrate 100 of the display device according to another modified embodiment of the present invention includes an input pad region IPDR, a side pad region SPDR, and an output pad region OPDR.

A plurality of input pads IPD may be arranged in the input pad region IPDR, and a plurality of side pads SPD may be arranged in the side pad region SPDR. Since, in an embodiment, the input pad region IPDR and the side pad region SPDR may be the same as those having been described with reference to FIG. 2, the description thereof will be omitted.

A plurality of output pads OPD_k are arranged in the output pad region OPDR, and may be arranged to form a plurality of rows. In an embodiment, the plurality of output pads OPD_k may be arranged to form first to fourth output pad rows OPD_R1, OPD_R2, OPD_R3, and OPD_R4.

Further, the output pads OPD_k arranged in the same row may be arranged in parallel along the row direction (that is, a direction in which the first direction axis D1 extends). Some of the respective output pads OPD_k extend along the column direction (that is, a direction in which the second directional axis D2 extends), and the others of the output pads OPD_k extend in the column direction (that is, a direction in which the second directional axis D2 extends) to have a predetermined inclination.

Further, each of the output bumps OPB_k arranged to correspond to the output pads OPD_k may also have a similar structure to the output pad. That is, the output bumps OPB_k arranged in the same row may be arranged in parallel along the row direction (that is, a direction in which the first direction axis D1 extends). Some of the respective output bumps OPB_k extend along the column direction (that is, a direction in which the second directional axis D2 extends), and the others thereof extend in the column direction (that is, a direction in which the second directional axis D2 extends) to have a predetermined inclination.

In an embodiment, among the output pads OPD_k arranged in the first output pad row OPD_R1, the output pads OPD_k disposed at the center shown in FIG. 23 extend in the column direction (that is, a direction in which the second directional axis D2 extends). Among the output pads OPD_k arranged in the first output pad row OPD_R1, remaining output pads OPD_k, except for the output pads OPD_k disposed at the center, may extend in a direction in which an inclination gradually increases compared with the column direction (that is, a direction in which the second directional axis D2 extends) as these remaining output pads OPD_k are farther away from the output pads OPD_k disposed at the center. This arrangement of the output pads OPD_k in the first output pad row OPD_R1 may be equally applied to the output pads OPD_k of the second to fourth output pad rows OPD_R2, OPD_R3, and OPD_R4. Further, among the output pads OPD_k disposed in each of the first to fourth output pad rows OPD_R1, OPD_R2, OPD_R3, and OPD_R4, the output pads OPD_k disposed at the center of each of the first to fourth output pad rows OPD_R1, OPD_R2, OPD_R3, and OPD_R4 are not limited in extending in the column direction (that is, a direction in which the second direction axis D2 extends), and the other output pads OPD_k may extend in the column direction (that is, a direction in which the second direction axis D2 extends). Further, all of the output pads OPD_k may also be formed to have a predetermined inclination with respect to the column direction (that is, a direction in which the second directional axis D2 extends).

In addition, each of the output bumps OPB_k may be formed to be inclined so as to coincide with the inclination of the corresponding output pad OPD_k.

Through the structure of the output pads OPD_k and the output bumps OPB_k, when the drive circuit chip 300 is misaligned in the column direction (that is, a direction in which the second directional axis D2 extends), this misalignment can be easily corrected.

However, even if the output pad OPD_k and the output bump OPB_k according to the present embodiment are arranged in the same row, the extended lengths may be different from each other. That is, some of the output pads OPD_k and output bumps OPB_k extend along the column direction (that is a direction in which the second directional axis D2 extends), whereas the others thereof extend along a direction inclined to the column direction. Therefore, the lengths of the respective output pads OPD_k and output bumps OPB_k, which are measured along the extended direction, may be different.

Illustratively, since the output pads OPD_k disposed at the center of the first output pad row OPD_R1 extend in the column direction (that is, a direction in which the second directional axis D2 extends), the length measured in the extending direction may be equal to the length measured in the column direction (that is, a direction in which the second directional axis D2 extends). In contrast, in the case of the output pads OPD_k not disposed at the center of the first output pad row OPD_R1, the length measured in the extending direction may be longer than the length measured in the column direction (that is, a direction in which the second directional axis D2 extends). In particular, as the output pads OPD_k are arranged to be away from the center of the first output pad row OPD_R1, the extending length may become longer. Although the structure of the output pads OPD and the output bumps OPB has been described throughout this specification, this structure may be equally applied to the input pads IPD and the input bumps IPB. Moreover, this structure may also be equally applied to the side pads SPD and the side bumps SPB.

As described above, according to embodiments of the present invention, a display device includes a drive circuit chip safely mounted on a substrate without causing cracks or damage.

The effects of the present invention are not limited by the foregoing, and other various effects are anticipated herein.

Although some exemplary embodiments of the present invention have been disclosed for illustrative purposes, those skilled in the art will appreciate that various modifications, additions and substitutions are possible, without departing from the scope and spirit of the invention as set forth in the accompanying claims.

The effects of the present invention are not limited by the foregoing, and other various effects are anticipated herein.

Further, those skilled in the art will appreciate that many variations and modifications can be made to the described exemplary embodiments without substantially departing from the principles of the present invention. Therefore, the disclosed exemplary embodiments of the invention are used in a generic and descriptive sense only and not for purposes of limitation.

What is claimed is:

1. A display device comprising:
a substrate;
conductive pads arranged on the substrate, the conductive pads including a first conductive pad, a second conductive pad, a third conductive pad, a fourth conductive pad, and a fifth conductive pad; and
a circuit chip including bumps electrically connected with the conductive pads, the bumps including a first bump overlapping the first conductive pad, a second bump overlapping the second conductive pad, a third bump overlapping the third conductive pad, a fourth bump overlapping the fourth conductive pad, and a fifth bump overlapping the fifth conductive pad,
wherein the first conductive pad, the second conductive pad, the third conductive pad, the fourth conductive pad, and the fifth conductive pad are arranged in a first direction,
wherein at least one of the second conductive pad, the third conductive pad, and the fourth conductive pad is extended in a second direction intersecting the first direction,
wherein each of the second conductive pad, the third conductive pad, and the fourth conductive pad includes a first end overlapping a first reference line extending in the first direction and a second end opposite to the first end in the second direction and overlapping a second reference line extending in the first direction,
wherein each of the second bump, the third bump, and the fourth bump includes a first end and a second end opposite to the first end in the second direction, and
wherein the first end of one of the second bump, the third bump, and the fourth bump is shifted in the second direction relative to the first end of another one of the second bump, the third bump, and the fourth bump.

2. The display device of claim 1, wherein at least one of the second bump, the third bump, and the fourth bump is extended in the second direction.

3. The display device of claim 1, wherein the second bump, the third bump, and the fourth bump are sequentially disposed in the first direction.

4. The display device of claim 3, wherein the first end of the third bump is shifted in the second direction relative to the first end of the second bump.

5. The display device of claim 4, wherein the first end of the third bump is shifted in the second direction relative to the first end of the fourth bump.

6. The display device of claim 3, wherein a shifted length between the first end of the third bump and the first end of the second bump is substantially the same as a shifted length between the first end of the third bump and the first end of the fourth bump.

7. The display device of claim 5, wherein the second end of the third bump is shifted in the second direction relative to the second end of the second bump, and
wherein the second end of the third bump is shifted in the second direction relative to the second end of the fourth bump.

8. The display device of claim 7, wherein a shifted length between the first end of the third bump and the first end of the second bump is substantially the same as a shifted length between the first end of the third bump and the first end of the fourth bump, and
wherein a shifted length between the second end of the third bump and the second end of the second bump is substantially the same as a shifted length between the second end of the third bump and the second end of the fourth bump.

9. The display device of claim 8, wherein the shifted length between the first end of the third bump and the first end of the second bump is substantially the same as the shifted length between the second end of the third bump and the second end of the second bump.

10. The display device of claim 4, wherein a length of the third bump is different from a length of the second bump.

11. The display device of claim 10, wherein the second end of the second bump, the second end of the third bump, and the second end of the fourth bump are aligned in the first direction.

12. The display device of claim 10,
wherein the second end of the second bump and the second end of the fourth bump are aligned in the first direction, and wherein the second end of the second bump and the second end of the third bump are not aligned in the first direction.

13. The display device of claim 3, wherein the bumps further include a sixth bump,
wherein the sixth bump includes a first end and a second end opposite to the first end in the second direction,
wherein the first end of the fourth bump and the first end of the sixth bump are shifted in the second direction relative to the first end of the third bump.

14. The display device of claim 13, wherein the first end of the fourth bump and the first end of the sixth bump are aligned in the first direction, and
wherein the first end of the second bump and the first end of the third bump are aligned in the first direction.

15. The display device of claim 13, wherein the second end of the fourth bump and the second end of the sixth bump are shifted in the second direction relative to the second end of the third bump, and
wherein the second end of the second bump and the second end of the third bump are aligned in the first direction.

* * * * *